(12) United States Patent
Yabe

(10) Patent No.: US 10,951,187 B2
(45) Date of Patent: Mar. 16, 2021

(54) SWITCHED CAPACITOR AMPLIFIER CIRCUIT, VOLTAGE AMPLIFICATION METHOD, AND INFRARED SENSOR DEVICE

(71) Applicant: LAPIS Semiconductor Co., Ltd., Yokohama (JP)

(72) Inventor: Koji Yabe, Yokohama (JP)

(73) Assignee: LAPIS SEMICONDUCTOR CO., LTD., Yokohama (JP)

( * ) Notice: Subject to any disclaimer, the term of this patent is extended or adjusted under 35 U.S.C. 154(b) by 324 days.

(21) Appl. No.: 15/966,608

(22) Filed: Apr. 30, 2018

(65) Prior Publication Data
US 2018/0331667 A1  Nov. 15, 2018

(30) Foreign Application Priority Data
May 9, 2017 (JP) ............... JP2017-93049

(51) Int. Cl.
*H03F 11/00* (2006.01)
*H03F 3/45* (2006.01)
(Continued)

(52) U.S. Cl.
CPC .............. *H03F 11/00* (2013.01); *G01J 1/46* (2013.01); *G01J 5/12* (2013.01); *G01J 5/14* (2013.01);
(Continued)

(58) Field of Classification Search
CPC ...... H03F 11/00; H03F 3/005; H03F 3/45475; H03F 3/45968; H03F 2200/27; H03F 2200/375; H03F 2200/411; H03F 2203/45356; H03F 2203/45512; H03F 2203/45514; H03F 2203/45528; H03F 2203/45616; H03F 2203/45631;
(Continued)

(56) References Cited

U.S. PATENT DOCUMENTS 5,475,337 A * 12/1995 Tatsumi .................. H03F 3/005
327/307
5,617,093 A *  4/1997 Klein .................... G11C 27/026
341/150
(Continued)

FOREIGN PATENT DOCUMENTS

JP      H06-045875 A      2/1994

*Primary Examiner* — Nathaniel T Woodward
*Assistant Examiner* — Philip L Cotey
(74) *Attorney, Agent, or Firm* — Rabin & Berdo, P.C.

(57) ABSTRACT

A switched capacitor amplifier circuit includes an operational amplifier, a first capacitor and a second capacitor each having one end connected to a negative input terminal of the operational amplifier, a first switching circuit configured to connect the other end of the first capacitor and a signal source during a first operation, a second switching circuit configured to connect the other end of the second capacitor and the output terminal of the operational amplifier so as to connect the output terminal and the negative input terminal of the operational amplifier through the second capacitor during the second operation, and an impedance converter circuit configured to convert an output impedance of the signal source into a specified impedance, the impedance converter circuit being connected between the first switching circuit and the other end of the first capacitor.

4 Claims, 22 Drawing Sheets

(51) Int. Cl.
*H03F 3/00* (2006.01)
*G01K 17/00* (2006.01)
*G01J 5/34* (2006.01)
*G01J 5/12* (2006.01)
*G01J 5/14* (2006.01)
*G01J 1/46* (2006.01)

(52) U.S. Cl.
CPC ............... *G01J 5/34* (2013.01); *G01K 17/003* (2013.01); *H03F 3/005* (2013.01); *H03F 3/45475* (2013.01); *H03F 3/45968* (2013.01); *H03F 2200/27* (2013.01); *H03F 2200/375* (2013.01); *H03F 2200/411* (2013.01); *H03F 2203/45356* (2013.01); *H03F 2203/45512* (2013.01); *H03F 2203/45514* (2013.01); *H03F 2203/45528* (2013.01); *H03F 2203/45616* (2013.01); *H03F 2203/45631* (2013.01); *H03F 2203/45634* (2013.01)

(58) Field of Classification Search
CPC ..... H03F 2203/45634; G01J 1/46; G01J 5/12; G01J 5/14; G01J 5/34; G01K 17/003
See application file for complete search history.

(56) References Cited

U.S. PATENT DOCUMENTS

| | | | | |
|---|---|---|---|---|
| 5,977,803 A * | 11/1999 | Tsugai | ............... | G01R 27/2605 327/337 |
| 5,986,497 A * | 11/1999 | Tsugai | ............... | G01D 5/24 327/554 |
| 6,515,612 B1 * | 2/2003 | Abel | ............... | G11C 27/026 327/382 |
| 7,345,530 B1 * | 3/2008 | Li | ............... | H03F 3/005 330/51 |
| 8,461,918 B2 * | 6/2013 | Sakaguchi | ............... | H03F 3/005 327/554 |
| 8,633,766 B2 * | 1/2014 | Khlat | ............... | H03F 3/45475 330/127 |
| 9,231,524 B2 * | 1/2016 | Cowley | ............... | H04B 1/40 |
| 2002/0171773 A1 * | 11/2002 | Gower | ............... | H03F 3/005 348/691 |
| 2003/0155967 A1 * | 8/2003 | Fujimoto | ............... | H03F 3/005 330/9 |
| 2008/0094272 A1 * | 4/2008 | Horie | ............... | H03M 1/1225 341/158 |
| 2010/0237936 A1 * | 9/2010 | Takeda | ............... | H03F 3/45475 330/98 |
| 2011/0062941 A1 * | 3/2011 | Yoshida | ............... | G01H 11/08 324/71.1 |
| 2011/0193611 A1 * | 8/2011 | Sakaguchi | ............... | H03F 3/005 327/337 |
| 2011/0298644 A1 * | 12/2011 | Ohba | ............... | H03F 3/005 341/155 |
| 2012/0313701 A1 * | 12/2012 | Khlat | ............... | H03F 1/0277 330/127 |
| 2014/0204985 A1 * | 7/2014 | Cowley | ............... | H04B 1/40 375/219 |

* cited by examiner

FIG.22

| S0 | S1 | S2 | S3 | G(VOLTAGE GAIN) |
|---|---|---|---|---|
| ON | OFF | OFF | OFF | $2\times(R5+R4+R3+R2)/R1$ |
| OFF | ON | OFF | OFF | $2\times(R5+R4+R3)/(2\times R2+R1)$ |
| OFF | OFF | ON | OFF | $2\times(R5+R4)/(2\times(R3+R2)+R1)$ |
| OFF | OFF | OFF | ON | $2\times R5/(2\times(R4+R3+R2)+R1)$ |

SWITCHED CAPACITOR AMPLIFIER CIRCUIT, VOLTAGE AMPLIFICATION METHOD, AND INFRARED SENSOR DEVICE

BACKGROUND OF THE INVENTION

1. Field of the Invention

The present invention relates to a switched capacitor amplifier circuit, a voltage amplification method, and an infrared sensor device.

2. Description of the Related Art

An operational amplifier that amplifies an input voltage and generates an output voltage generally includes a transistor pair as an amplifier stage. The transistor pair is constituted of transistors each having a characteristic difference (such as threshold variation) corresponding to manufacturing variation and the like. Due to the characteristic difference, an offset voltage is generated in the operational amplifier.

Used as a circuit that compensates the offset voltage of the operational amplifier is a switched capacitor circuit (for example, Japanese Patent Application Laid-Open No. Hei. 6-45875). For example, the switched capacitor circuit includes a first capacitor (hereinafter referred to as a capacitor C1) having one end connected to a negative input terminal (inverting input terminal) of the operational amplifier. The capacitor C1 has the other end connected to a signal source or a ground potential through a switch. The switched capacitor circuit also includes a second capacitor (hereinafter referred to as a capacitor C2) having one end connected to the negative input terminal of the operational amplifier. The capacitor C2 has the other end connected to an output terminal of the operational amplifier or a ground potential through a switch. The negative input terminal and the output terminal of the operational amplifier are connected to each other through the capacitor C2, or directly connected to each other without use of the capacitor C2 depending on the switching operation of the switch. The operational amplifier has a positive input terminal (non-inverting input terminal) connected to a ground potential.

During first operation for retaining an electric charge corresponding to an input voltage, the other end of the capacitor C1 is connected to the signal source, while the other end of the capacitor C2 is connected to the ground potential. Since the negative input terminal and the output terminal of the operational amplifier is short-circuited, a voltage same as an offset voltage is output from the output terminal of the operational amplifier. In this state, the capacitor C1 (capacitance: C1) stores an electric charge defined by $Q1=C1\times(Vin+Vos)$ where Vin is an input voltage, and Vos is an offset voltage. The capacitor C2 (capacitance: C2) stores an electric charge defined by $Q2=C2\times Vos$.

During second operation for outputting an amplified voltage, the other end of the capacitor C1 is connected to the ground potential, and the other end of the capacitor C2 is connected to the output terminal of the operational amplifier. The negative input terminal of the operational amplifier is connected to the output terminal through the capacitor C2. The capacitor C1 stores an electric charge defined by $Q1=C1\times Vos$. The capacitor C2 stores an electric charge defined by $Q2=C2\times Vos+C1\times Vin$. Accordingly, the output voltage is defined by $Vout=(C2/C1)\times Vin$, so that the offset voltage is canceled. For example, in the case of C1=100 pF and C2=1 pF, a voltage gain of 100 is obtained.

SUMMARY OF THE INVENTION

In the switched capacitor circuit as described above, the signal source that supplies an input voltage needs to charge and discharge the capacitor C1 (for example, 100 pF). Accordingly, when the signal source has a high impedance, it is difficult to perform high-speed switching operation (switching of charging operation of an electric charge and output operation of an amplified voltage). In order to obtain a higher voltage gain, the value of the capacitor C1 needs to be increased more. This necessitates further reduction in the switching speed.

Reducing the value of the capacitor C2 makes it possible to reduce the value of the capacitor C1 while maintaining the voltage gain. However, when the value of the capacitor C2 is too small, the electric charge of the capacitor C2 is discharged due to an off-leak current of the switch (transistor) connected across both the ends of the capacitor C2. This makes it difficult to obtain a desired voltage gain.

The present invention has been made in view of the above-described problems, and it is therefore an object of the present invention to provide a switched capacitor amplifier circuit capable of providing a desired voltage gain by cancelling an offset voltage, while switching the charging operation of an electric charge and the output operation of an amplified voltage at high speed.

A switched capacitor amplifier circuit according to the present invention is a switched capacitor amplifier circuit configured to perform a first operation and a second operation, the first operation being configured to retain an electric charge corresponding to an input voltage upon reception of the input voltage from a signal source, the second operation being configured to amplify the input voltage and to output the amplified input voltage as an output voltage. The switched capacitor amplifier circuit includes: an operational amplifier having a positive input terminal and a negative input terminal, and an output terminal, the operational amplifier being configured to output the output voltage from the output terminal; a first capacitor having one end connected to the negative input terminal of the operational amplifier; a second capacitor having one end connected to the negative input terminal of the operational amplifier; a first switching circuit configured to connect the other end of the first capacitor to the signal source during the first operation, and to connect the other end of the first capacitor to a specified potential during the second operation; a second switching circuit configured to connect the other end of the second capacitor to the fixed potential while short-circuiting the output terminal and the negative input terminal of the operational amplifier during the first operation, and to connect the other end of the second capacitor and the output terminal of the operational amplifier so as to connect the output terminal and the negative input terminal of the operational amplifier through the second capacitor during the second operation; and an impedance converter circuit configured to convert an output impedance of the signal source into a specified impedance, the impedance converter circuit being connected between the first switching circuit and the other end of the first capacitor.

A switched capacitor amplifier circuit according to the present invention is a switched capacitor amplifier circuit configured to perform a first operation and a second operation, the first operation being configured to retain an electric charge corresponding to an input voltage upon reception of the input voltage from a signal source, the second operation being configured to amplify the input voltage and to output the amplified input voltage as an output voltage. The switched capacitor amplifier circuit includes: an operational amplifier having a positive input terminal, a negative input terminal and an output terminal, the operational amplifier being configured to output the output voltage from the output terminal; a first capacitor having one end connected to the negative input terminal of the operational amplifier; a second capacitor having one end connected to the negative input terminal of the operational amplifier; a first switching circuit configured to connect the other end of the first capacitor to a specified potential during the first operation, and to connect the other end of the first capacitor and the signal source during the second operation; a second switching circuit configured to connect the other end of the second capacitor to the specified potential while short-circuiting the output terminal and the negative input terminal of the operational amplifier during the first operation, and to connect the other end of the second capacitor and the output terminal of the operational amplifier so as to connect the output terminal and the negative input terminal of the operational amplifier through the second capacitor during the second operation; and an impedance converter circuit configured to convert an output impedance of the signal source into a specified impedance, the impedance converter circuit being connected between the first switching circuit and the other end of the first capacitor.

A switched capacitor amplifier circuit according to the present invention is a switched capacitor amplifier circuit configured to perform a first operation and a second operation, the first operation being configured to retain an electric charge corresponding to an input voltage upon reception of the input voltage from a signal source, the second operation being configured to amplify the input voltage and to output the amplified input voltage as an output voltage. The switched capacitor amplifier circuit includes: an operational amplifier having a positive input terminal, a negative input terminal and an output terminal, the operational amplifier being configured to output the output terminal from the output terminal; a first capacitor having one end connected to the positive input terminal of the operational amplifier; a second capacitor having one end connected to the negative input terminal of the operational amplifier; a third capacitor having one end connected to the negative input terminal of the operational amplifier and the other end connected to a specified potential; a first switching circuit configured to connect the other end of the first capacitor and the signal source during the first operation, and to connect the other end of the first capacitor to the specified potential during the second operation; a second switching circuit configured to connect the other end of the second capacitor to the specified potential while short-circuiting the output terminal and the negative input terminal of the operational amplifier during the first operation, and to connect the other end of the second capacitor and the output terminal of the operational amplifier so as to connect the output terminal and the negative input terminal of the operational amplifier through the second capacitor during the second operation; and an impedance converter circuit configured to convert an output impedance of the signal source into a specified impedance, the impedance converter circuit being connected between the first switching circuit and the other end of the first capacitor.

A switched capacitor amplifier circuit according to the present invention is a switched capacitor amplifier circuit configured to perform a first operation and a second operation, the first operation being configured to retain an electric charge corresponding to an input voltage upon reception of the input voltage from a signal source, the second operation being configured to amplify the input voltage and to output the amplified input voltage as an output voltage. The switched capacitor amplifier circuit includes: an operational amplifier having a positive input terminal, a negative input terminal, and an output terminal, the operational amplifier being configured to output the output voltage from the output terminal; a first capacitor having one end connected to the positive input terminal of the operational amplifier; a second capacitor having one end connected to the negative input terminal of the operational amplifier; a third capacitor having one end connected to the negative input terminal of the operational amplifier and the other end connected to a specified potential; a first switching circuit configured to connect the other end of the first capacitor to the specified potential during the first operation, and to connect the other end of the first capacitor and the signal source during the second operation; a second switching circuit configured to connect the other end of the second capacitor to the specified potential while short-circuiting the output terminal and the negative input terminal of the operational amplifier during the first operation, and to connect the other end of the second capacitor and the output terminal of the operational amplifier so as to connect the output terminal and the negative input terminal of the operational amplifier through the second capacitor during the second operation; and an impedance converter circuit configured to convert an output impedance of the signal source into a specified impedance, the impedance converter circuit being connected between the first switching circuit and the other end of the first capacitor.

A switched capacitor amplifier circuit according to the present invention is a switched capacitor amplifier circuit configured to perform a first operation and a second operation, the first operation being configured to retain an electric charge corresponding to a first input voltage upon reception of the first input voltage from a first signal source and to retain an electric charge corresponding to a second input voltage upon reception of the second input voltage from a second signal source, the second operation being configured to amplify a difference between the first input voltage and the second input voltage and to output the amplified difference as an output voltage. The switched capacitor amplifier circuit includes: an operational amplifier having a positive input terminal, a negative input terminal, and an output terminal, the operational amplifier being configured to output the output voltage from the output terminal; a first capacitor having one end connected to the negative input terminal of the operational amplifier; a second capacitor having one end connected to the negative input terminal of the operational amplifier; a third capacitor having one end connected to the positive input terminal of the operational amplifier; a first switching circuit configured to connect the other end of the first capacitor and the first signal source during the first operation, and to connect the other end of the first capacitor to a specified potential during the second operation; a second switching circuit configured to connect the other end of the second capacitor to the specified potential while short-circuiting the output terminal and the negative input terminal of the operational amplifier during the first operation, and to connect the other end of the second capacitor and the output terminal of the operational amplifier so as to connect the output terminal and the negative input terminal of the operational amplifier through the second capacitor during the second operation; and a third switching circuit configured to connect the other end of the third capacitor to the second signal source during the first operation, and to connect the other end of the third capacitor to the specified potential during the second operation; and an impedance converter circuit configured to convert an output impedance of the first signal source and the second signal source into a specified impedance, the impedance converter circuit being connected between the first switching circuit and the other end of the first capacitor and between the third switching circuit and the other end of the third capacitor.

A voltage amplification method according to the present invention is a voltage amplification method in a switched capacitor amplifier circuit, the switched capacitor amplifier circuit including an operational amplifier configured to output an output voltage, a first capacitor having one end connected to a negative input terminal of the operational amplifier, a second capacitor having one end connected to the negative input terminal of the operational amplifier, a first switching circuit configured to switch a connection destination of the other end of the first capacitor to a signal source or a specified potential, a second switching circuit configured to switch a connection destination of the other end of the second capacitor to the specified potential or an output terminal of the operational amplifier while short-circuiting between the output terminal and the negative input terminal of the operational amplifier, or to connect the output terminal and the negative input terminal of the operational amplifier through the second capacitor, an impedance converter circuit configured to convert an output impedance of the signal source into a specified impedance, the impedance converter circuit being connected between the first switching circuit and the other end of the first capacitor. The voltage amplification method includes the steps of: connecting the signal source and an input terminal of the impedance converter circuit, short-circuiting the output terminal and the negative input terminal of the operational amplifier, and connecting the other end of the second capacitor to the specified potential; and connecting the input terminal of the impedance converter circuit to the specified potential, and connecting the negative input terminal and the output terminal of the operational amplifier through the second capacitor.

An infrared sensor device according to the present invention is an infrared sensor device configured to detect a surface temperature of a measurement target on a basis of an infrared ray radiated from the measurement target. The infrared sensor device includes: a thermopile configured to generate a measurement voltage indicative of the surface temperature; an amplifier circuit configured to amplify the measurement voltage to generate an output voltage, wherein the amplifier circuit is a switched capacitor amplifier circuit configured to perform a first operation and a second operation, the first operation being configured to retain an electric charge corresponding to the measurement voltage upon reception of the measurement voltage from the thermopile, the second operation being configured to output the output voltage, the switched capacitor amplifier circuit includes: an operational amplifier having a positive input terminal, a negative input terminal, and an output terminal, the operational amplifier being configured to output the voltage terminal from the output terminal; a first capacitor having one end connected to the negative input terminal of the operational amplifier; a second capacitor having one end connected to the negative input terminal of the operational amplifier; a first switching circuit configured to connect the other end of the first capacitor and the thermopile during the first operation, and to connect the other end of the first capacitor to a specified potential during the second operation; a second switching circuit configured to connect the other end of the second capacitor to the specified potential while short-circuiting the output terminal and the negative input terminal of the operational amplifier during the first operation, and to connect the other end of the second capacitor and the output terminal of the operational amplifier so as to connect the output terminal and the negative input terminal of the operational amplifier through the second capacitor during the second operation; and an impedance converter circuit configured to convert an output impedance of the thermopile into a specified impedance, the impedance converter circuit being connected between the first switching circuit and the other end of the first capacitor.

According to the switched capacitor amplifier circuit according to the present invention, it becomes possible to obtain a desired voltage gain by cancelling an offset voltage, while switching charging operation of an electric charge and output operation of an amplified voltage.

BRIEF DESCRIPTION OF THE DRAWINGS

Features of the present invention will be described in the following description with reference to the accompanying drawings.

FIG. 22 is a table illustrating a relation between a selecting signal and a voltage gain in the seventh embodiment.

DETAILED DESCRIPTION OF THE INVENTION

Embodiments of the present invention will be described below with reference to the drawings. Throughout the description in each of the embodiments and the accompanying drawings below, components substantially identical or equivalent are designated by identical reference symbols.

First Embodiment

Figure 1:
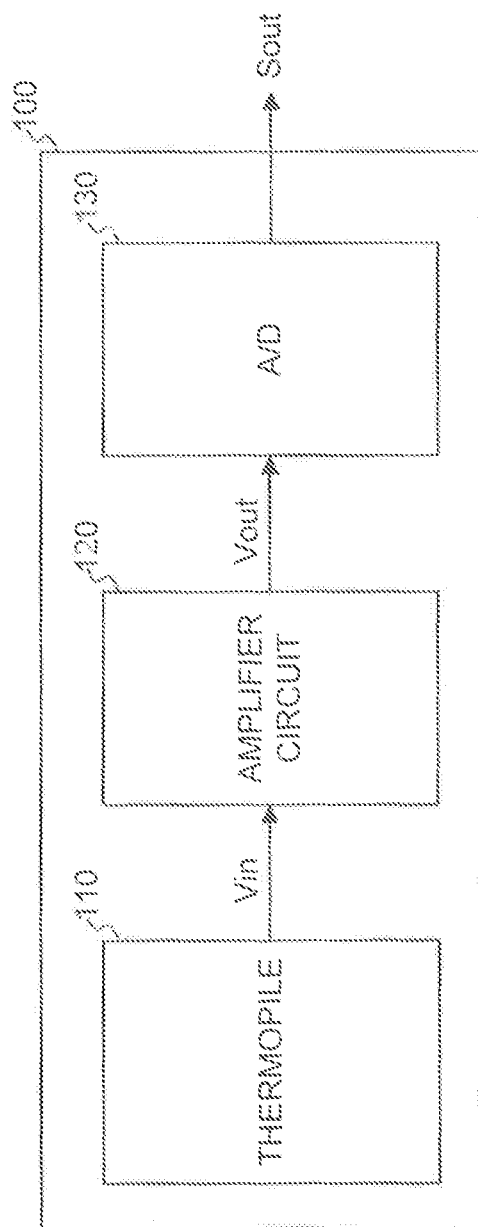
FIG. 1 is a circuit diagram illustrating a configuration of an infrared sensor device including an amplifier circuit according to a first embodiment.

FIG. 1 is a block diagram illustrating a configuration of an infrared sensor device mounted with an amplifier circuit according to the present embodiment. The infrared sensor device 100 has a thermopile sensor 110, an amplifier circuit 120, and an A/D conversion circuit 130.

The thermopile sensor 110 includes a thermopile constituted of a plurality of thermocouples connected in series or in parallel. The thermopile sensor 110 converts thermal energy radiated from a measurement target into electrical energy, and outputs the electrical energy as a measurement voltage corresponding to surface temperature of the measurement target. The thermopile sensor 110 supplies the measurement voltage to the amplifier circuit 120 as an input voltage Vin. The thermopile sensor 110 has an impedance of the order of a few hundred kΩ, for example.

Upon reception of the input voltage Vin from the thermopile sensor 110, the amplifier circuit 120 amplifies the input voltage Vin, and outputs the amplified voltage as an output voltage Vout. The amplifier circuit 120 performs a first operation and a second operation, while periodically switching the first operation and the second operation in response to a clock signal. The first operation is configured to retain an electric charge corresponding to the input voltage Vin. The second operation is configured to output the output voltage Vout.

The A/D conversion circuit 130 performs analog to digital conversion of the output voltage Vout, and outputs the converted voltage as a sensor output Sout.

Figure 2:
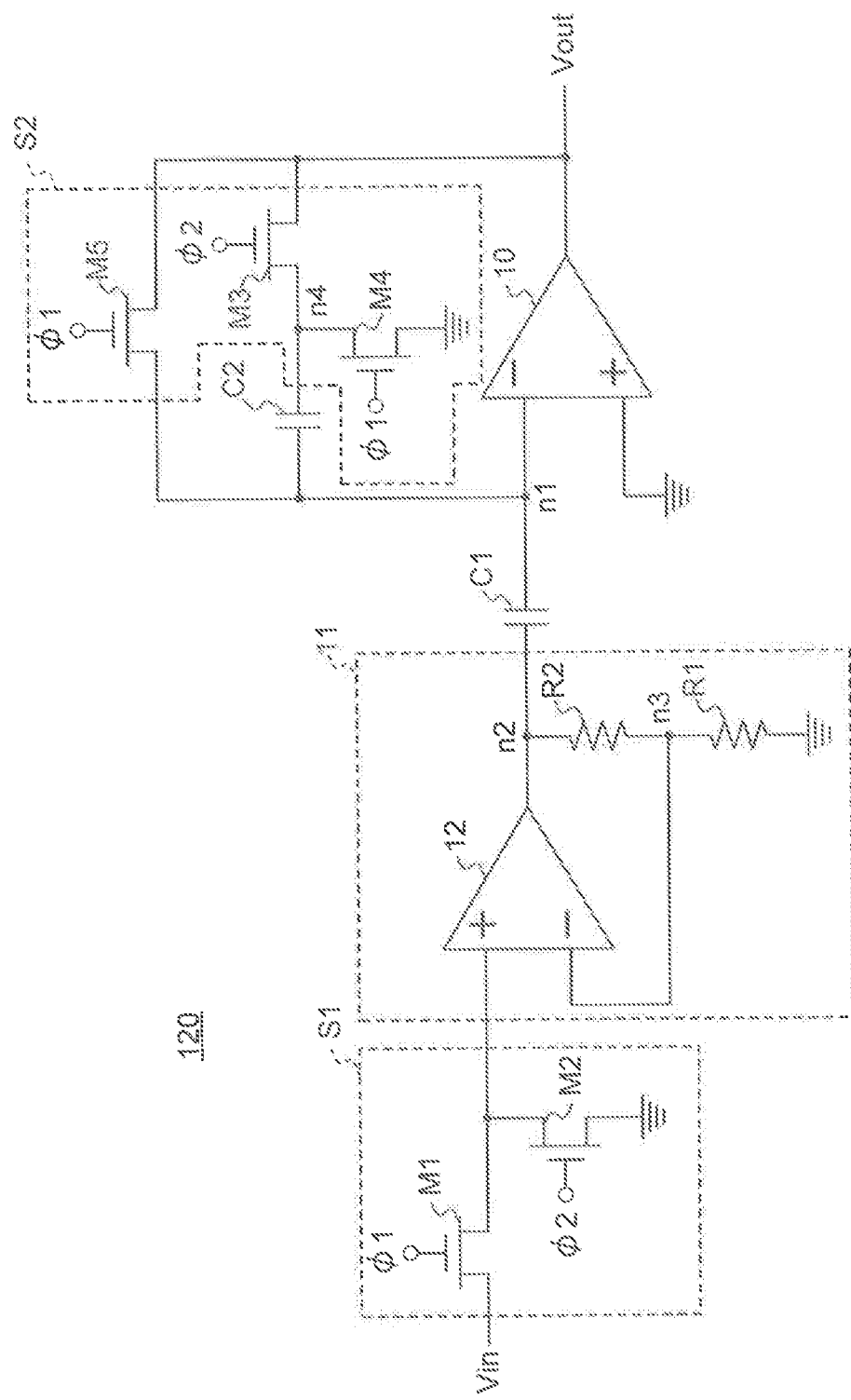
FIG. 2 is a circuit diagram illustrating the configuration of the amplifier circuit according to the first embodiment.

FIG. 2 is a circuit diagram illustrating a configuration of the amplifier circuit 120. The amplifier circuit 120 includes an operational amplifier 10, a capacitor C1, a capacitor C2, a switching circuit S1, a switching circuit S2, and an impedance converter circuit 11.

The operational amplifier 10 has a positive input terminal (non-inverting input terminal) connected to a ground potential. The operational amplifier 10 has a negative input terminal (inverting input terminal) connected to one end of the capacitor C1 and to one end of the capacitor C2 through a node n1. The operational amplifier 10 has an output terminal that outputs the output voltage Vout.

The impedance converter circuit 11 is a circuit that converts an output impedance of the signal source (thermopile circuit 110) into a specified impedance. The impedance converter circuit 11 is configured as a voltage amplifier circuit having an operational amplifier 12, a resistance R1, and a resistance R2. In the following description, the impedance converter circuit 11 is also called a voltage amplifier circuit 11.

The operational amplifier 12 has an output terminal connected to the other end of the capacitor C1 and to one end of the resistance R2 through a node n2. The operational amplifier 12 has a negative input terminal connected to a node n3 between the resistance R1 and the resistance R2.

The resistances R1 and R2 are connected in series between the node n2 and a ground potential. The resistance R1 has one end connected to the ground potential. The resistance R1 has the other end connected to the node n3. The resistance R2 has one end connected to the node n2. The resistance R2 has the other end connected to the node n3. The resistance R1 has a resistance value of 1 kΩ, for example. The resistance R2 has a resistance value of 10 kΩ, for example.

The switching circuit S1 is a switching circuit that switches connection upon reception of a first switching signal φ1 and a second switching signal φ2. The switching circuit S1 is constituted of a switch M1 and a switch M2.

The first switching signal φ1 and the second switching signal φ2 have a signal level that complementarily changes to a logic level 0 (L level) or a logic level 1 (H level). The operating state of the amplifier circuit 120 switches to the first operation and the second operation in response to the change in the signal level of the first switching signal φ1 and the second switching signal φ2. For example, during the first operation, the first switching signal φ1 has the logic level 1 (H level), while the second switching signal φ2 has the logic level 0 (L level). During the second operation, the first switching signal φ1 has the logic level 0 (L level), while the second switching signal φ2 has the logic level 1 (H level).

The switch M1 has one end connected to an output terminal of the thermopile sensor 110 that is a signal source of the input voltage Vin (hereinafter also simply called a signal source). The switch M1 has the other end connected to a positive input terminal of the operational amplifier 12. The switch M1 is a switch element turned on or off in response to the first switching signal φ1. The switch M1 is constituted of an N-channel MOS transistor, for example. The switch M1 is controlled to be turned on during the first operation and to be turned off during the second operation. When the switch M1 is turned on, the positive input terminal of the operational amplifier 12 and the signal source are connected, so that the input voltage Vin is supplied to the positive input terminal of the operational amplifier 12.

The switch M2 has one end connected to the positive input terminal of the operational amplifier 12. The switch M2 has the other end connected to a ground potential. The switch M2 is a switch element turned on or off in response to the second switching signal φ2. The switch M2 is constituted of an N-channel MOS transistor, for example. The switch M2 is controlled to be turned off during the first operation and to be turned on during the second operation. When the switch M2 is turned on, the ground potential is supplied to the positive input terminal of the operational amplifier 12. Namely, it can be said that the positive input terminal of the operational amplifier 12 is connected to the ground potential.

The switching circuit S2 is a switching circuit that switches connection upon reception of the first switching signal φ1 and the second switching signal φ2. The switching circuit S2 is constituted of a switch M3, a switch M4, and a switch M5.

The switch M3 has one end connected to the other end of the capacitor C2. The switch M3 has the other end connected to the output terminal of the operational amplifier 10. The switch M3 is a switch element turned on or off in response to the second switching signal φ2. The switch M3 is constituted of an N-channel MOS transistor, for example. The switch M3 is controlled to be turned off during the first operation and to be turned on during the second operation. When the switch M3 is turned on, the other end of the capacitor C2 and the output terminal of the operational amplifier 10 are connected to each other. Accordingly, feedback connection between the output terminal and the negative input terminal of the operational amplifier 10 is established through the capacitor C2.

The switch M4 has one end connected to the other end of the capacitor C2 and to the one end of the switch M3 through a node n4. The switch M4 has the other end connected to a ground potential. The switch M4 is a switch element turned on or off in response to the first switching signal φ1. The switch M4 is constituted of an N-channel MOS transistor, for example. The switch M4 is controlled to be turned on during the first operation and to be turned off during the second operation. When the switch M4 is turned on, the ground potential is supplied to the other end of the capacitor C2. Namely, it can be said that the other end of the capacitor C2 is connected to the ground potential.

The switch M5 has one end connected to the one end of the capacitor C1 and to the negative input terminal of the operational amplifier 10 through the node n1. The switch M5 has the other end connected to the output terminal of the operational amplifier 10. The switch M5 is a switch element tuned on or off in response to the first switching signal φ1. The switch M5 is constituted of an N-channel MOS transistor, for example. The switch M5 is controlled to be turned on during the first operation and to be turned off during the second operation. When the switch M5 is turned on, the output terminal and the negative input terminal of the operational amplifier 10 are short-circuited.

During the first operation and the second operation of the amplifier circuit 120, the capacitors C1 and C2 serve as capacitative elements (capacitors) that store (retain) an electric charge. The capacitor C1 is interposed between the output terminal of the operational amplifier 12 and the negative input terminal of the operational amplifier 10. The capacitor C2 is connected between the negative input terminal of the operational amplifier 10 and the one end of the switch M3. When the switch M3 is turned on, the capacitor C2 serves as a feedback capacitance inserted to a connection line that connects the output terminal and the negative input terminal of the operational amplifier 10.

Next, the operation of the amplifier circuit 120 will be described with reference to FIGS. 3, 4 and 5.

Figure 3:
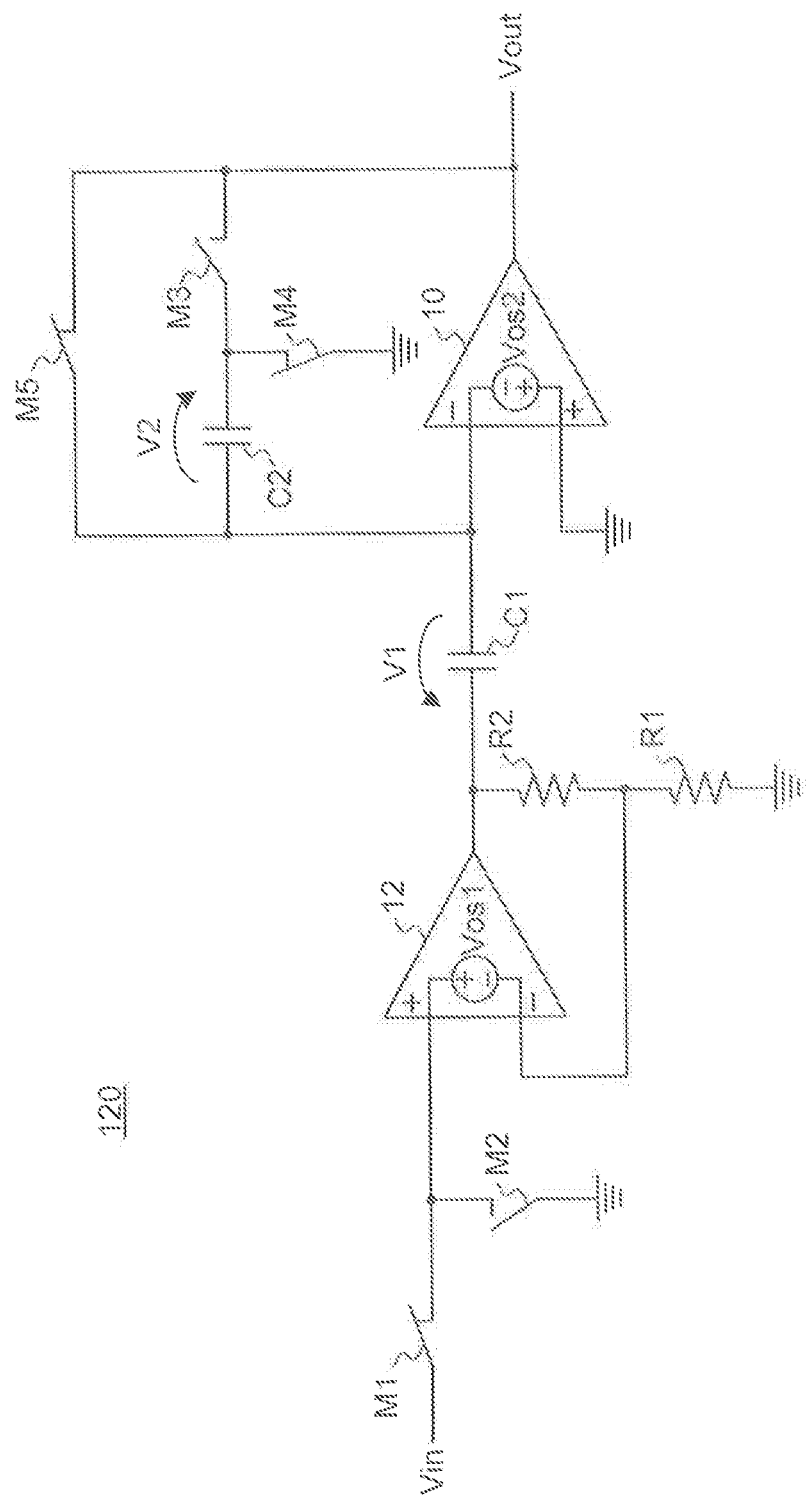
FIG. 3 is a diagram illustrating a state of the amplifier circuit according to the first embodiment during first operation.

FIG. 3 illustrates the state of the amplifier circuit 120 during the first operation. In the first operation, the switches M1, M4, and M5 are turned on, while the switches M2 and M3 are turned off. As a consequence, the input voltage Vin is supplied to the positive input terminal of the operational amplifier 12, and the negative input terminal and the output terminal of the operational amplifier 10 are short-circuited.

Since the positive input terminal of the operational amplifier 10 is grounded, and the negative input terminal and the output terminal of the operational amplifier 10 are short-circuited, an offset voltage (−Vos2) of the operational amplifier 10 is output as the output voltage Vout. In this case, an electric charge Q1 stored in the capacitor C1 (capacitance C1) is expressed by the following Expression (1). An electric charge Q2 stored in the capacitor C2 (capacitance C2) is expressed by the following Expression (2).

[Expression 1]

$$Q_1 = C_1 \times V_1 = C_1 \times ((1+R_2/R_1) \times (V_{in} - V_{os1}) + V_{os2}) \quad (1)$$

[Expression 2]

$$Q_2 = C_2 \times V_2 = C_2 \times V_{os2} \quad (2)$$

Figure 4:
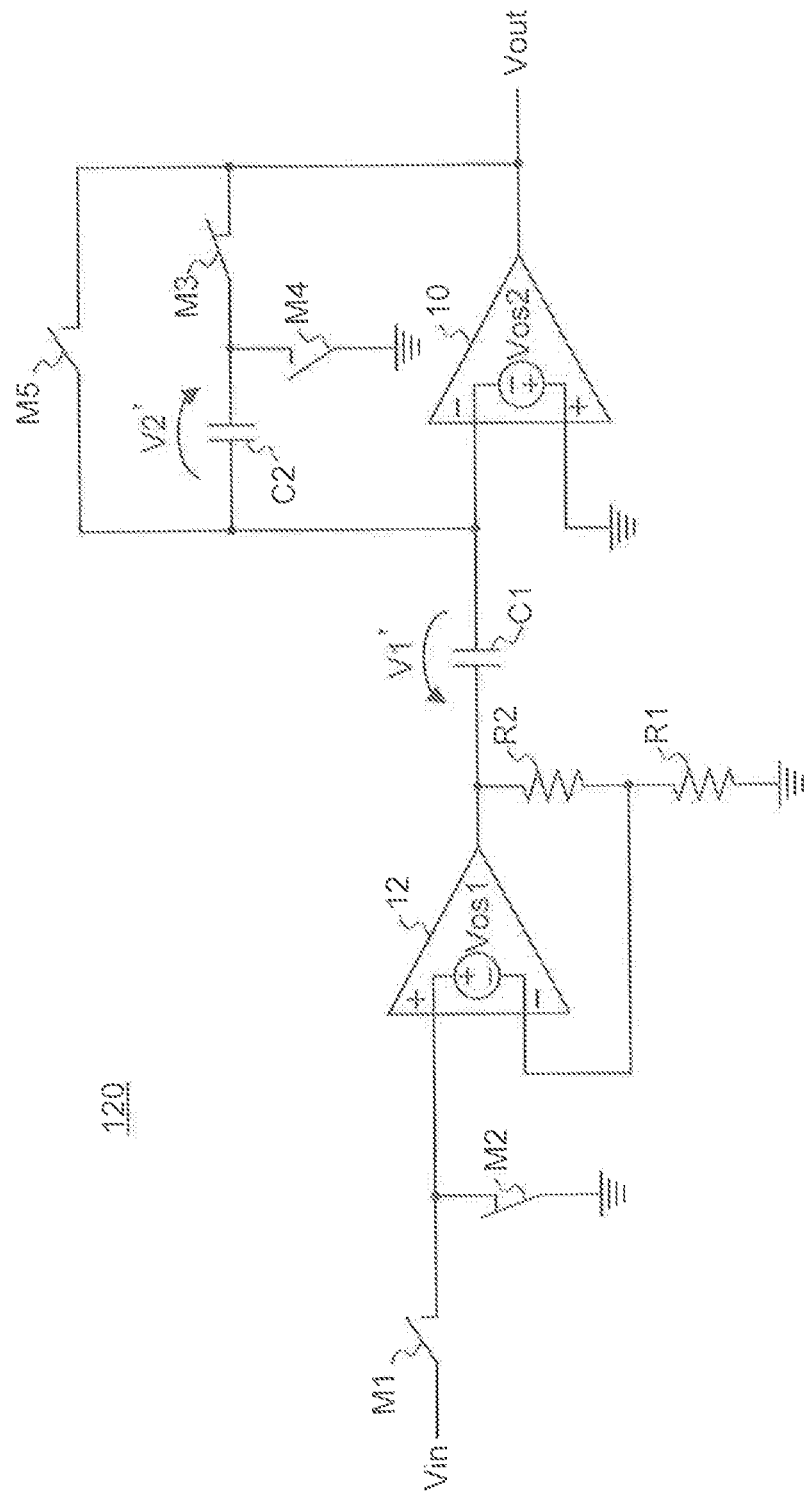
FIG. 4 is a diagram illustrating a state of the amplifier circuit according to the first embodiment during the second operation.

FIG. 4 illustrates the state of the amplifier circuit 120 during the second operation. In the second operation, the switches M2 and M3 are turned on, while the switches M1, M4, and M5 are turned off. As a consequence, the positive input terminal of the operational amplifier 12 is grounded, and the output terminal of the operational amplifier 10 is connected to the negative input terminal through the capacitor C2. In this case, an electric charge Q1' stored in the capacitor C1 is expressed by the following Expression (3). An electric charge Q2' stored in the capacitor C2 is expressed by the following Expression (4).

[Expression 3]

$$Q'_1 = C_1 \times V'_1 = C_1 \times ((1+R_2/R_1)(-V_{os1}) + V_{os2}) \quad (3)$$

[Expression 4]

$$Q'_2 = Q_2 + Q_1 - Q'_1 = C_2 \times V_{os2} + C_1 \times ((1+R_2/R_1) \times V_{in} \quad (4)$$

Based on Expressions (3) and (4), a voltage V2' applied across both the ends of the capacitor C2 is calculated as in Expression (5). The output voltage Vout of the operational amplifier 10 is calculated as in Expression (6).

[Expression 5]

$$V'_2 = Q'_2/C_2 = V_{os2} + C_1/C_2 \times (1+R_2/R_1) \times V_{in} \quad (5)$$

[Expression 6]

$$V_{out} = V'_2 - V_{os2} = V_{os2} + C_1/C_2 \times (1+R_2/R_1) \times V_{in} - V_{os2} = C_1/C_2 \times (1+R_2/R_1) \times V_{in} \quad (6)$$

As is seen from Expression (6), the output voltage Vout is obtained by multiplying a ratio between the capacitance C1 and the capacitance C2 by a value obtained by adding one to a ratio between the resistance R1 and the resistance R2. As a result, the offset voltages Vos1 and Vos2 are canceled. When R1=1 kΩ, R2=10 kΩ, C1=10 pF, and C2=1 pF, a voltage gain of 110 is obtained.

In accordance with time change in the signal level of the first switching signal φ1 and the second switching signal φ2, the amplifier circuit 120 repeatedly performs the first operation and the second operation.

Figure 5:
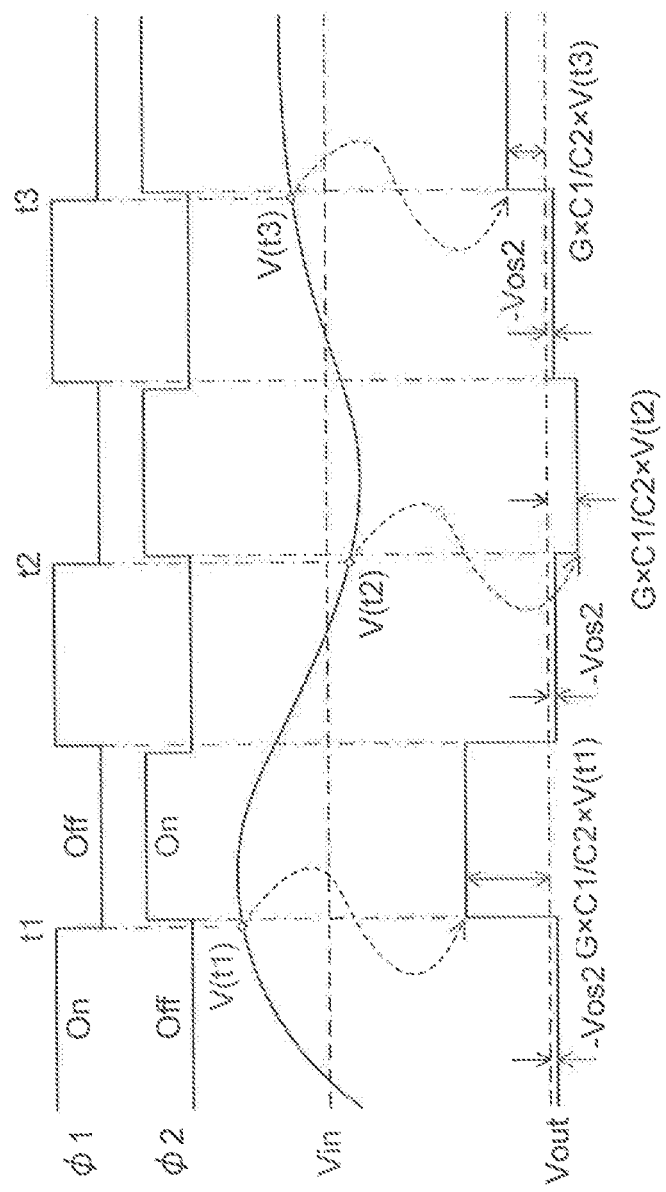
FIG. 5 is a time chart illustrating a relation among a switching signal, an input voltage, and an output voltage in the first embodiment.

FIG. 5 is a time chart illustrating the time change in the first switching signal φ1, the second switching signal φ2, the input voltage Vin, and the output voltage Vout.

During the period from the time when the first switching signal φ1 becomes H level to the time when the second switching signal φ2 becomes H level, the offset voltage (−Vos2) of the operational amplifier 10 is output as the output voltage Vout.

During the period from the time when the second switching signal φ2 becomes H level to the time when the first switching signal φ1 becomes H level, input voltages Vin (illustrated as V(t1), V(t2), and V(t3) in the drawing) at the times (illustrated as t1, t2, and t3 in the drawing) when each of the preceding first switching signals φ1 becomes L level are amplified, and the amplified input voltages are output as the output voltages Vout. For example, when the voltage amplifier circuit 11 has an amplification factor expressed by G, the output voltages Vout are equal to G×C1/C2×V(t1), G×C1/C2×V(t2), and G×C1/C2×V(t3), respectively.

As described in the foregoing, in the amplifier circuit 120 of the present embodiment, the impedance converter circuit 11 is interposed between the input terminal that receives supply of the input voltage Vin from the thermopile sensor 110 and the capacitor C1. Therefore, the capacitor C1 is charged and discharged not directly by the thermopile sensor 110 but by the impedance converter circuit 11 serving as a voltage amplifier circuit. Meanwhile, the thermopile sensor 110 charges and discharges an input stray capacitance of the impedance converter circuit 11, which is extremely lower in capacitance value than the capacitor C1.

As described before, the thermopile sensor 110 has a relatively high impedance. In contrast, the impedance converter circuit 11 is constituted of the operational amplifier 12, the resistance R1, and the resistance R2, and therefore the impedance converter circuit 11 is lower in impedance than the thermopile sensor 110. The input stray capacitance of the impedance converter circuit 11 is extremely lower than the capacitance value of the capacitor C1. Therefore, the amplifier circuit 120 of the present embodiment can charge and discharge the capacitor C1 in a short time. Hence, it becomes possible to obtain a desired voltage gain by cancelling an offset voltage, while switching the charging operation of an electric charge and the output operation of an amplified voltage.

Second Embodiment

Figure 6:
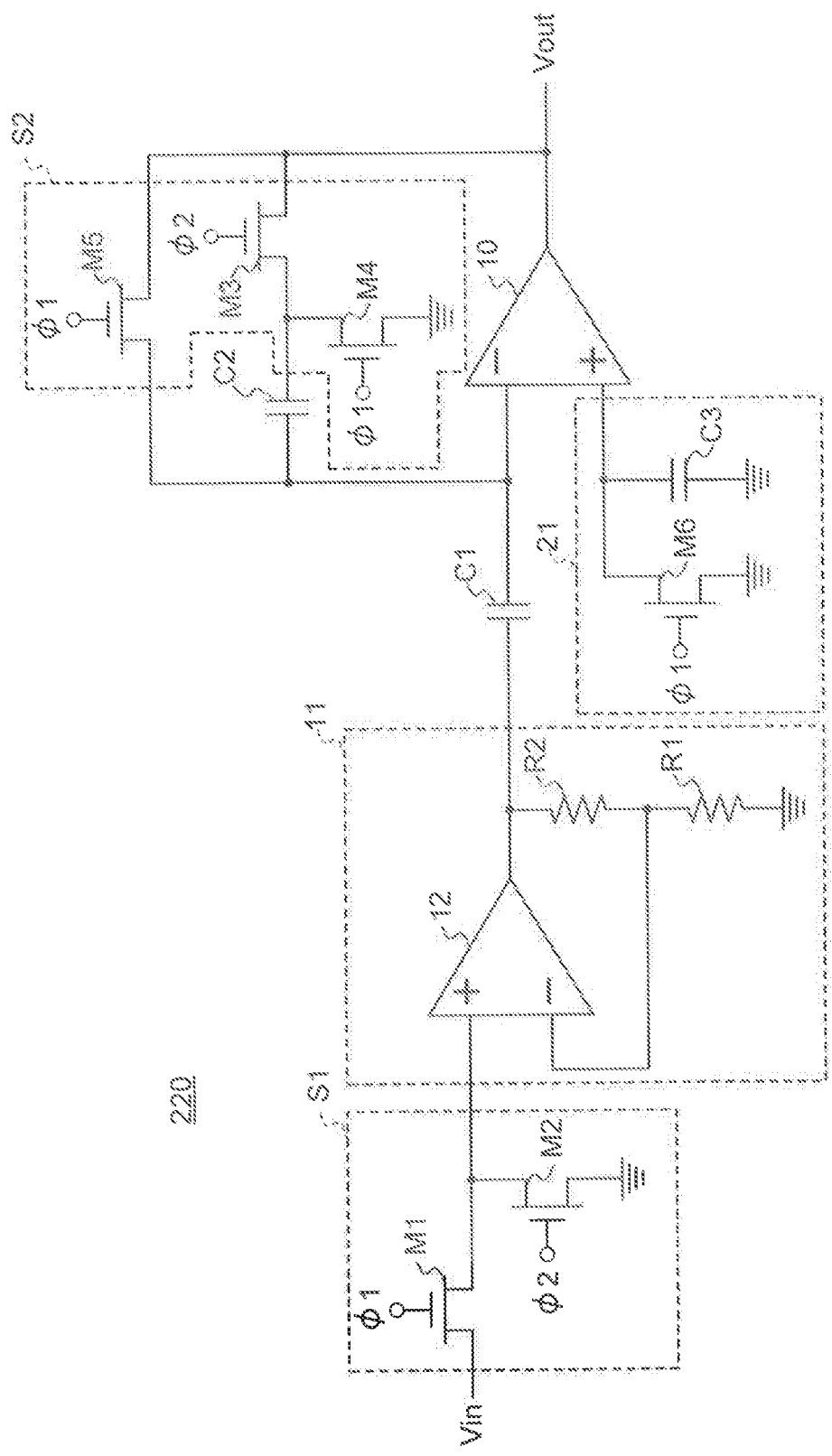
FIG. 6 is a circuit diagram illustrating a configuration of an amplifier circuit according to a second embodiment.

FIG. 6 is a circuit diagram illustrating a configuration of an amplifier circuit 220 according to a second embodiment. The amplifier circuit 220 is different from the amplifier circuit 120 according to the first embodiment in the point that the amplifier circuit 220 includes a clock feedthrough cancellation circuit 21 constituted of a switch M6 and a capacitor C3.

The capacitor C3 has one end connected to the positive input terminal of the operational amplifier 10. The capacitor C3 has the other end connected to a ground potential. The capacitor C3 has a capacitance value that is identical to a sum of the capacitance values of the capacitor C1 and the capacitor C2 (i.e., C3=C1+C2).

The switch M6 has one end connected to the positive input terminal of the operational amplifier 10. The switch M6 has the other end connected to a ground potential. The switch M6 is a switch element turned on or off in response to the first switching signal ϕ1. The switch M6 is controlled to be turned on during the first operation, and to be turned off during the second operation. When the switch M6 is turned on, the positive input terminal of the operational amplifier 10 is connected to the ground potential. The switch M6 is an N-channel MOS transistor, for example. The switch M6 is produced to have a dimension identical to that of a transistor constituting the switch M5.

The clock feedthrough cancellation circuit 21 is provided in order to cancel clock feedthrough generated in the amplifier circuit 220. The clock feedthrough is a phenomenon in which the electric charge of a capacitance that constitutes the switched capacitor amplifier circuit is discharged or charged due to a stray capacitance between the gate and drain or between the gate and source, when a MOS transistor as a switch element transitions from ON to OFF.

Hereinafter, the clock feedthrough phenomenon will be described with reference to FIGS. 7 to 9. The following description relates to an example in which the switches M1 to M6 are each constituted of an N-channel MOS transistor. The switches M1 to M6 are also called transistors M1 to M6.

Figure 7:
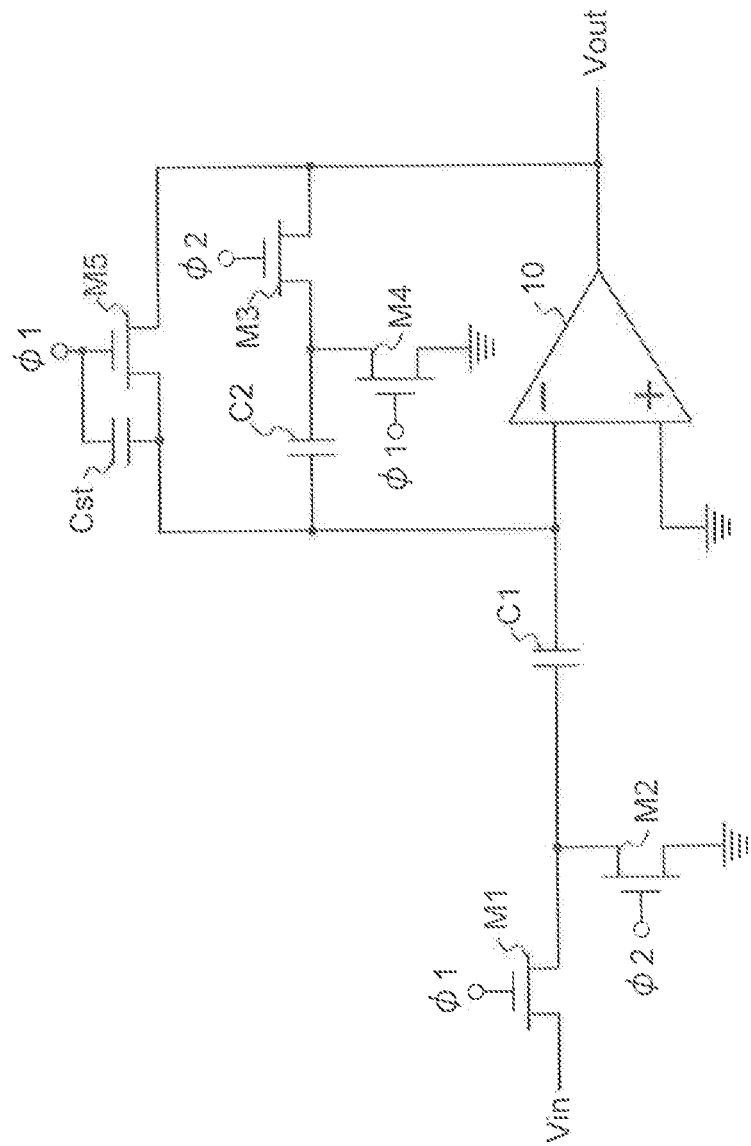
FIG. 7 is a diagram illustrating an amplifier circuit as a comparative example.

FIG. 7 illustrates a normal switched capacitor amplifier circuit as a comparative example, the circuit having neither the impedance converter circuit 11 according to the first embodiment nor the clock feedthrough cancellation circuit 21 according to the present embodiment.

A stray capacitance Cst is generated between the gate and drain of the transistor M5. However, a junction point between the transistor M1 and the transistor M2, and a junction point between the transistor M3 and the transistor M4 are connected to the fixed potential (sensor output, ground potential, and operational amplifier output) during both the first operation and the second operation. Even with the stray capacitance present in the transistors M1 to M4, the capacitance is charged and discharged to keep the specified potential. Accordingly, the stray capacitance does not affect the operation of the switched capacitor amplifier circuit.

Figure 8:
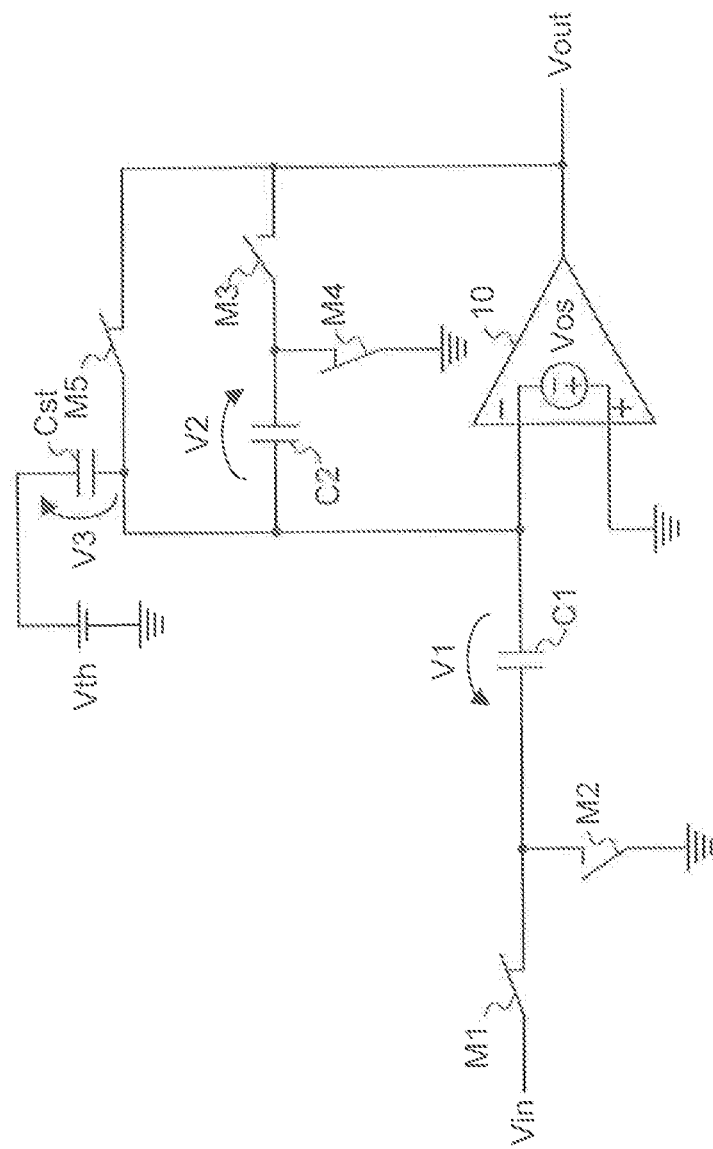
FIG. 8 is a diagram illustrating a state of the amplifier circuit of the comparative example during the first operation.

FIG. 8 illustrates the state where the transistors M1, M4, and M5 that receive supply of the first switching signal ϕ1 are turned on, while the transistors M2 and M3 that receive supply of the second switching signal ϕ2 are turned off, with each transistor being replaced with a switch. In FIG. 8, Vth represents a threshold voltage of the transistor M5, and V3 represents a voltage across both the ends of the stray capacitance Cst.

An electric charge Q1 stored in the capacitor C1 (capacitance C1), an electric charge Q2 stored in the capacitor C2 (capacitance C2), and an electric charge Qst stored in the stray capacitance Cst in this state are expressed by the following Expressions (7) to (9), respectively.

[Expression 7]

$$Q_1 = C_1 \times V_1 = C_1(V_{in} + V_{os}) \tag{7}$$

[Expression 8]

$$Q_2 = C_2 \times V_2 = C_2 \times V_{os} \tag{8}$$

[Expression 9]

$$Q_{st} = C_{st} \times V_3 = C_{st}(V_{th} + V_{os}) \tag{9}$$

Figure 9:
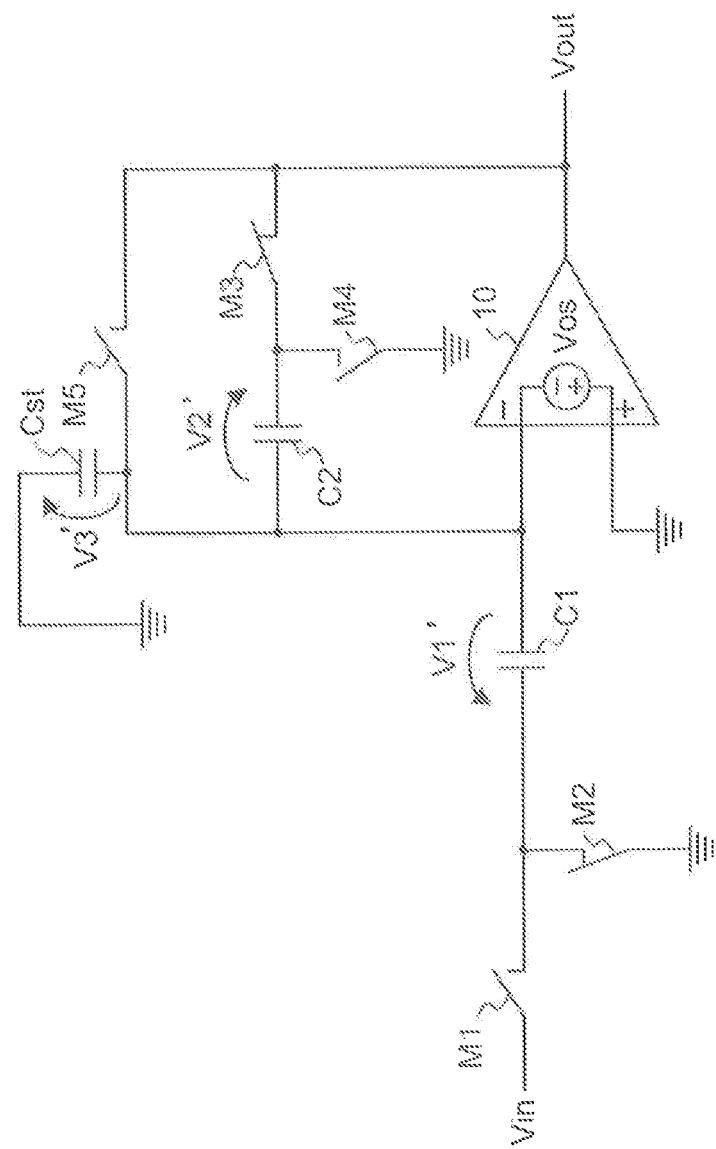
FIG. 9 is a diagram illustrating a state of the amplifier circuit of the comparative example during the second operation.

FIG. 9 illustrates the state where the transistors M1, M4, and M5 that receive supply of the first switching signal ϕ1 are turned off, while the transistors M2 and M3 that receive supply of the second switching signal ϕ2 are turned on, with each transistor being replaced with a switch. The stray capacitance Cst is directly connected to a ground potential, without the threshold voltage of the transistor M5 interposed therebetween.

An electric charge Q1' stored in the capacitor C1, an electric charge Q2' stored in the capacitor C2, and an electric charge Qst' stored in the stray capacitance Cst in this case are expressed by the following Expressions (10) to (12), respectively.

[Expression 10]

$$Q'_1 = C_1 \times V'_1 = C_1 \times V_{os} \tag{10}$$

[Expression 11]

$$Q'_2 = Q_2 + Q_1 - Q'_2 + Q_{st} - Q'_{st} \tag{11}$$

[Expression 12]

$$Q'_{st} = C_{st} \times V'_2 = C_{st} \times V_{os} \quad (12)$$

According to Expressions (10) to (12), the electric charge Q2' stored in the capacitor C2 is calculated as in the following Expression (13). The output voltage Vout of the operational amplifier 10 is calculated as in the following Expression (14).

[Expression 13]

$$\begin{aligned} Q'_2 &= C_2 \times V_{os} + C_1(V_{in} + V_{os}) - C_1 \times V_{os} + \\ &\quad C_{st}(V_{th} + V_{os}) - C_{st} \times V_{os} \\ &= C_2 \times V_{os} + C_1 \times V_{in} + C_{st} \times V_{th} \end{aligned} \quad (13)$$

[Expression 14]

$$\begin{aligned} V_{out} &= Q'_2/C_2 - V_{os} = V_{os} + C_1/C_2 \cdot V_{in} + \\ &\quad C_{st}/C_2 \cdot V_{th} - V_{os} \\ &= C_1/C_2 \cdot V_{in} + C_{st}/C_2 \cdot V_{th} \end{aligned} \quad (14)$$

Thus, an error of the output voltage caused by the clock feedthrough is generated in proportion to (Cst/C2)Vth.

Figure 10:
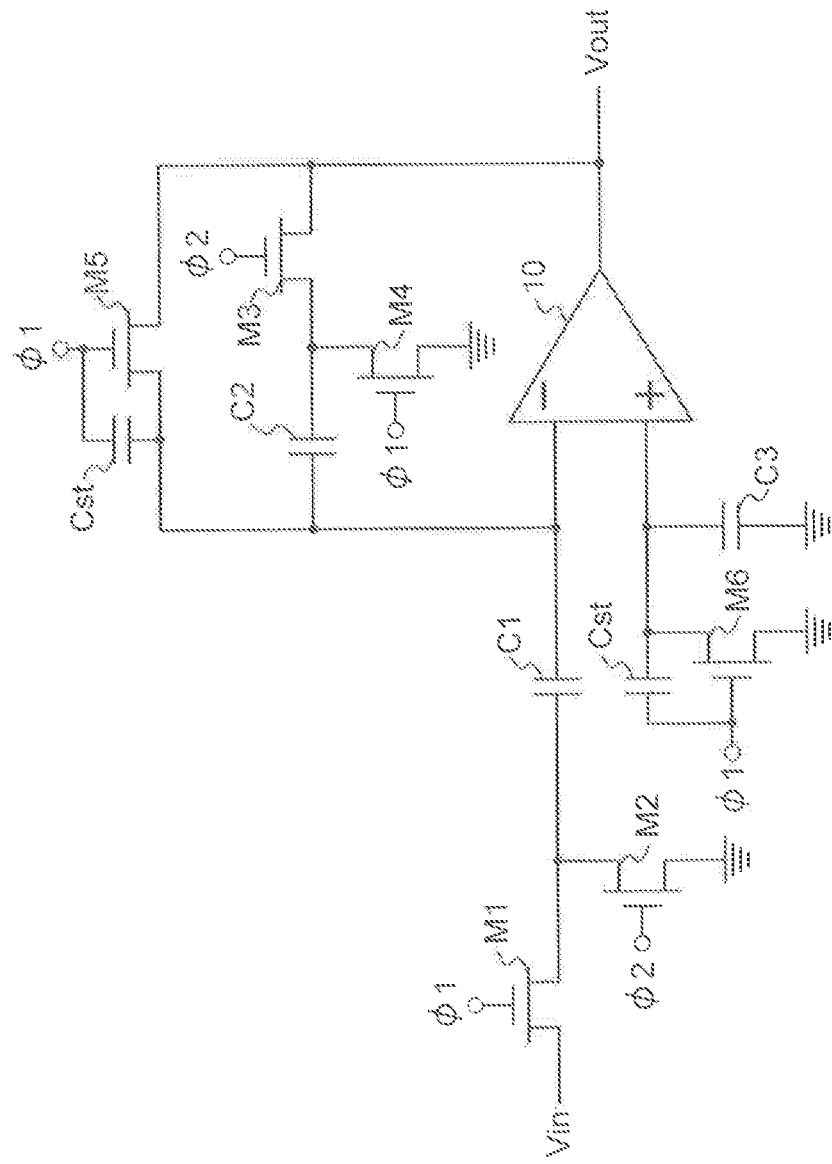
FIG. 10 is a diagram illustrating a circuit obtained by adding a clock feedthrough cancellation circuit to the amplifier circuit of the comparative example.

FIG. 10 illustrates a circuit formed by adding a clock feedthrough cancellation circuit, constituted of a transistor M6 and a capacitor C3, to the switched capacitor amplifier circuit of FIG. 7. A stray capacitance Cst is generated between the gate and drain of the transistor M6.

Figure 11:
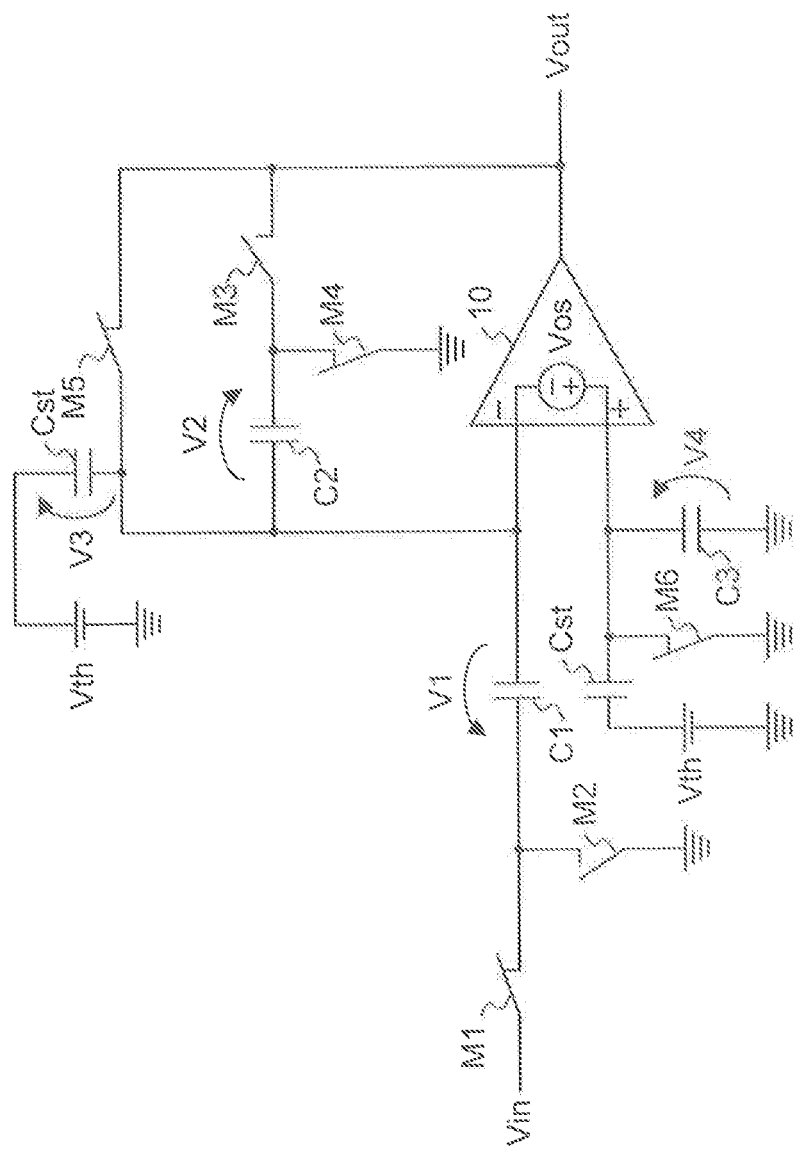
FIG. 11 is a diagram illustrating a state of the amplifier circuit of the comparative example during the first operation, the amplifier circuit having the clock feedthrough cancellation circuit added thereto.

FIG. 11 illustrates the state where the transistors M1, M4, M5, and M6 that receive supply of the first switching signal φ1 are turned on, while the transistors M2 and M3 that receive supply of the second switching signal φ2 are turned off, with each transistor being replaced with a switch.

An electric charge Q1 stored in the capacitor C1, an electric charge Q2 stored in the capacitor C2, and an electric charge Qst stored in the stray capacitance Cst in this state are expressed by the following Expressions (15) to (17). A voltage V4 across both the ends of the capacitor C3 is expressed by the following Expression (18).

[Expression 15]

$$Q_1 = C_1 \times V_1 = C_1(V_{in} + V_{os}) \quad (15)$$

[Expression 16]

$$Q_2 = C_2 \times V_2 = C_2 \times V_{os} \quad (16)$$

[Expression 17]

$$Q_{st} = C_{st} \times V_3 = C_{st}(V_{th} + V_{os}) \quad (17)$$

[Expression 18]

$$V_4 = 0 \quad (18)$$

Figure 12:
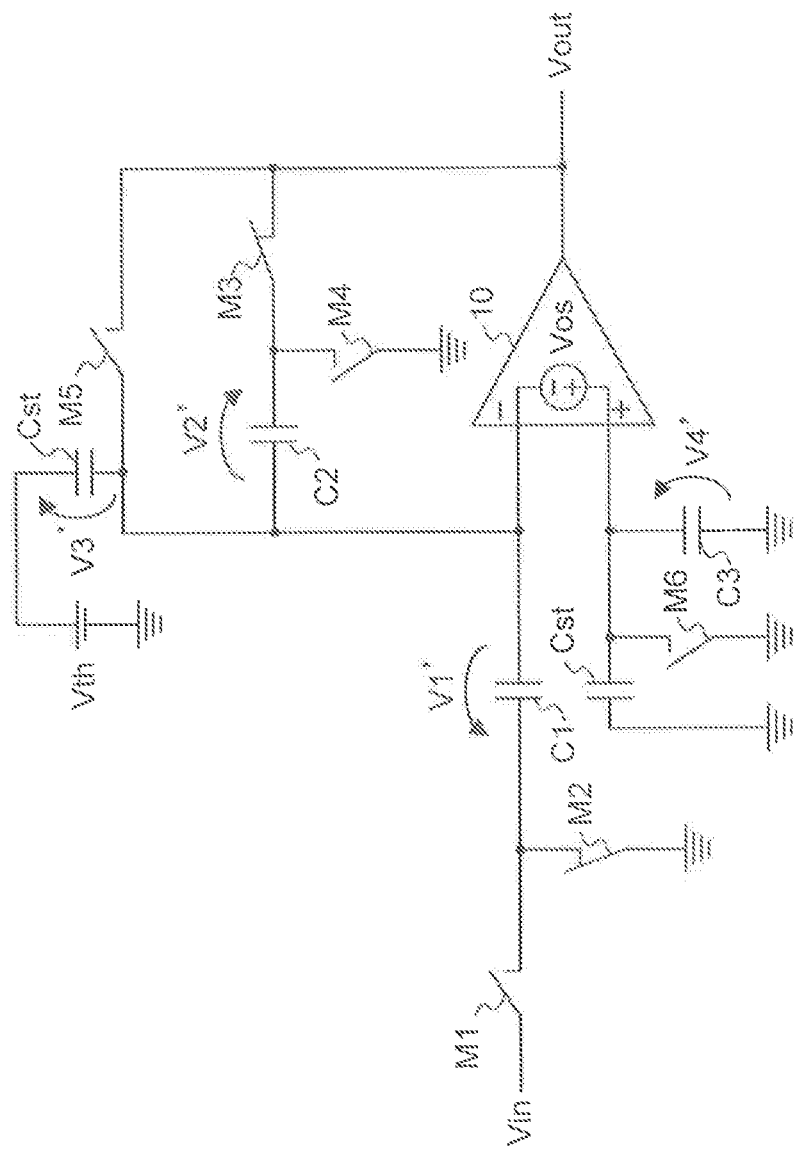
FIG. 12 is a diagram illustrating a state of the amplifier circuit of the comparative example during the second operation, the amplifier circuit having the clock feedthrough cancellation circuit added thereto.

FIG. 12 illustrates the state where the transistors M1, M4, M5, and M6 that receive supply of the first switching signal φ1 are turned off, while the transistors M2 and M3 that receive supply of the second switching signal φ2 are turned on, with each transistor being replaced with a switch.

An electric charge Q1' stored in the capacitor C1, an electric charge Q2' stored in the capacitor C2, and an electric charge Qst' stored in the stray capacitance Cst in this case are expressed by the following Expressions (19) to (21). A voltage V4' across both the ends of the capacitor C3 is expressed by the following Expression (22).

[Expression 19]

$$Q'_1 = C_1 \times V'_1 = C_1(V_{os} + V'_4) \quad (19)$$

[Expression 20]

$$Q'_2 = Q_2 + Q_1 - Q'_1 + Q_{st} - Q'_{st} \quad (20)$$

[Expression 21]

$$Q'_{st} = C_{st} \times V'_3 = C_{st}(V_{os} + V'_4) \quad (21)$$

[Expression 22]

$$V'_4 = C_{st}/(C_1 + C_2 + C_{st}) \cdot V_{th} \quad (22)$$

According to Expressions (19) to (22), the electric charge Q2' stored in the capacitor C2 is calculated as in Expression (23). The output voltage Vout of the operational amplifier 10 is calculated as in Expression (24).

[Expression 23]

$$\begin{aligned} Q'_2 &= C_2 \times V_{os} + C_1(V_{in} + V_{os}) - C_1(V_{os} + C_{st}/(C_1 + C_2 + C_{st}) \cdot V_{th}) + \\ &\quad C_{st} \times (V_{th} + V_{os}) - C_{st}(V_{os} + C_{st}/(C_1 + C_2 + C_{st}) \cdot V_{th}) \\ &= C_2 \times V_{os} + C_1 \times V_{in} - C_1/(C_1 + C_2 + C_{st}) \cdot C_{st} \times V_{th} + \\ &\quad C_{st} \times V_{th} - C_{st}/(C_1 + C_2 + C_{st}) \cdot C_{st} \times V_{th}) \\ &= C_2 \times V_{os} + C_1 \times V_{in} + (1 - (C_1 + C_{st})/(C_1 + C_2 + C_{st})) \cdot C_{st} \times V_{th} \end{aligned} \quad (23)$$

[Expression 24]

$$\begin{aligned} V_{out} &= (Q'_2/C_2) - (V_{os} + V'_4) \\ &= V_{os} + (C_1/C_2) \cdot V_{in} + (1 - (C_1 + C_{st})/(C_1 + C_2 + C_{st})) \cdot \\ &\quad (C_{st}/C_2) \times V_{th} - (V_{os} + C_{st}/(C_1 + C_2 + C_{st}) \cdot V_{th}) \\ &= (C_1/C_2) \cdot V_{in} + (1 - (C_1 + C_{st})/(C_1 + C_2 + C_{st})) \cdot (C_{st}/C_2) \times \\ &\quad V_{th} - C_{st}/(C_1 + C_2 + C_{st}) \cdot V_{th}) \\ &= (C_1/C_2) \cdot V_{in} + (1 - (C_1 + C_{st})/(C_1 + C_2 + C_{st}) - \\ &\quad C_2/(C_1 + C_2 + C_{st}))(C_{st}/C_2) \cdot V_{th} \\ &= (C_1/C_2) \cdot V_{in} \end{aligned} \quad (24)$$

According to a comparison between Expression (24) and Expression (14), an error ((Cst/C2) (Vth)) of the output voltage caused by the clock feedthrough is canceled and eliminated in Expression (24).

With reference to FIG. 6 again, the amplifier circuit 220 according to the present embodiment has the clock feedthrough cancellation circuit 21 in addition to the impedance converter circuit 11. Therefore, the amplifier circuit 220 according to the present embodiment can switch the charging operation of an electric charge and the output operation of an amplified voltage at high speed, while suppressing the influence of the clock feedthrough.

Third Embodiment

Figure 13:
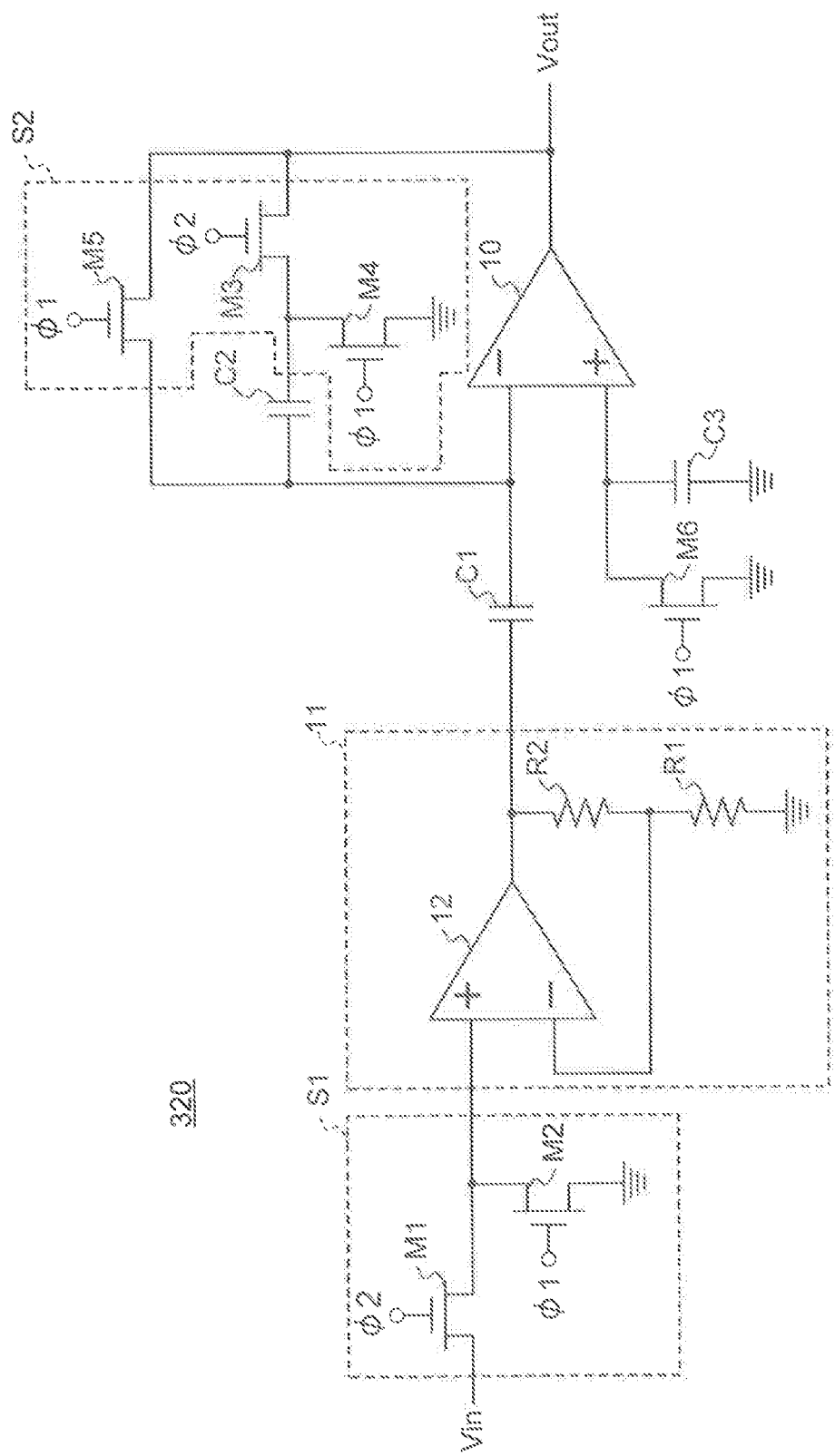
FIG. 13 is a circuit diagram illustrating a configuration of an amplifier circuit according to a third embodiment.

FIG. 13 is a circuit diagram illustrating a configuration of an amplifier circuit 320 according to a third embodiment. The amplifier circuit 320 is different from the amplifier circuit 220 according to the second embodiment in the point that the switching signals supplied to the switches M1 and M2 are exchanged. More specifically, the switch M1 is turned on or off upon reception of the second switching signal φ2. The switch M2 is turned on or off upon reception of the first switching signal φ1.

Figure 14:
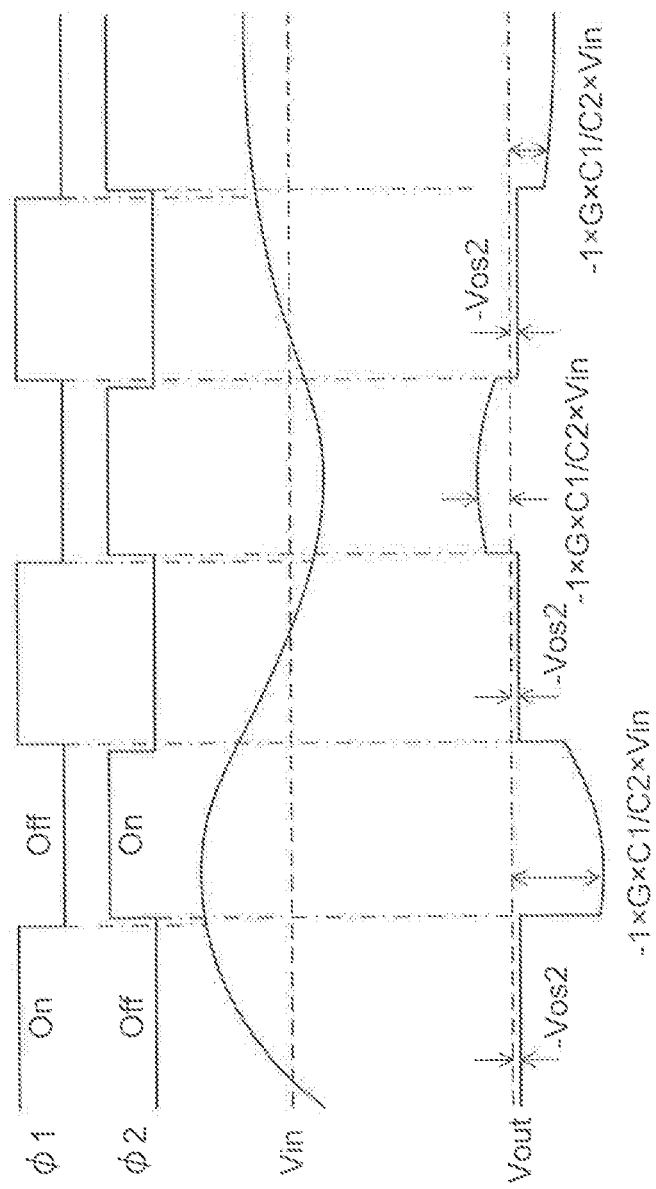
FIG. 14 is a time chart illustrating a relation among a switching signal, an input voltage, and an output voltage in the third embodiment.

FIG. 14 is a time chart illustrating time change in the first switching signal φ1, the second switching signal φ2, the input voltage Vin, and the output voltage Vout.

During the period when the first switching signal φ1 is at H level, i.e., during the period when the switches M2, M4, M5, and M6 are turned on, an offset voltage (−Vos2) of the operational amplifier 10 is output as the output voltage Vout.

During the period when the second switching signal φ2 is at H level, i.e., during the period when the switches M1 and M3 are turned on, a voltage obtained by amplifying the input voltage Vin with an amplification factor −1×G×(C1/C2) is output as the output voltage Vout. More specifically, in the subject period, an output voltage Vout=−1×G×(C1/C2)×Vin that is opposite in phase to the input voltage Vin is output. Here, G is an amplification factor of the voltage amplifier circuit 11.

The amplifier circuit 320 according to the present embodiment can provide an output voltage Vout having a signal waveform corresponding to change in the input voltage Vin during the second operation.

Fourth Embodiment

Figure 15:
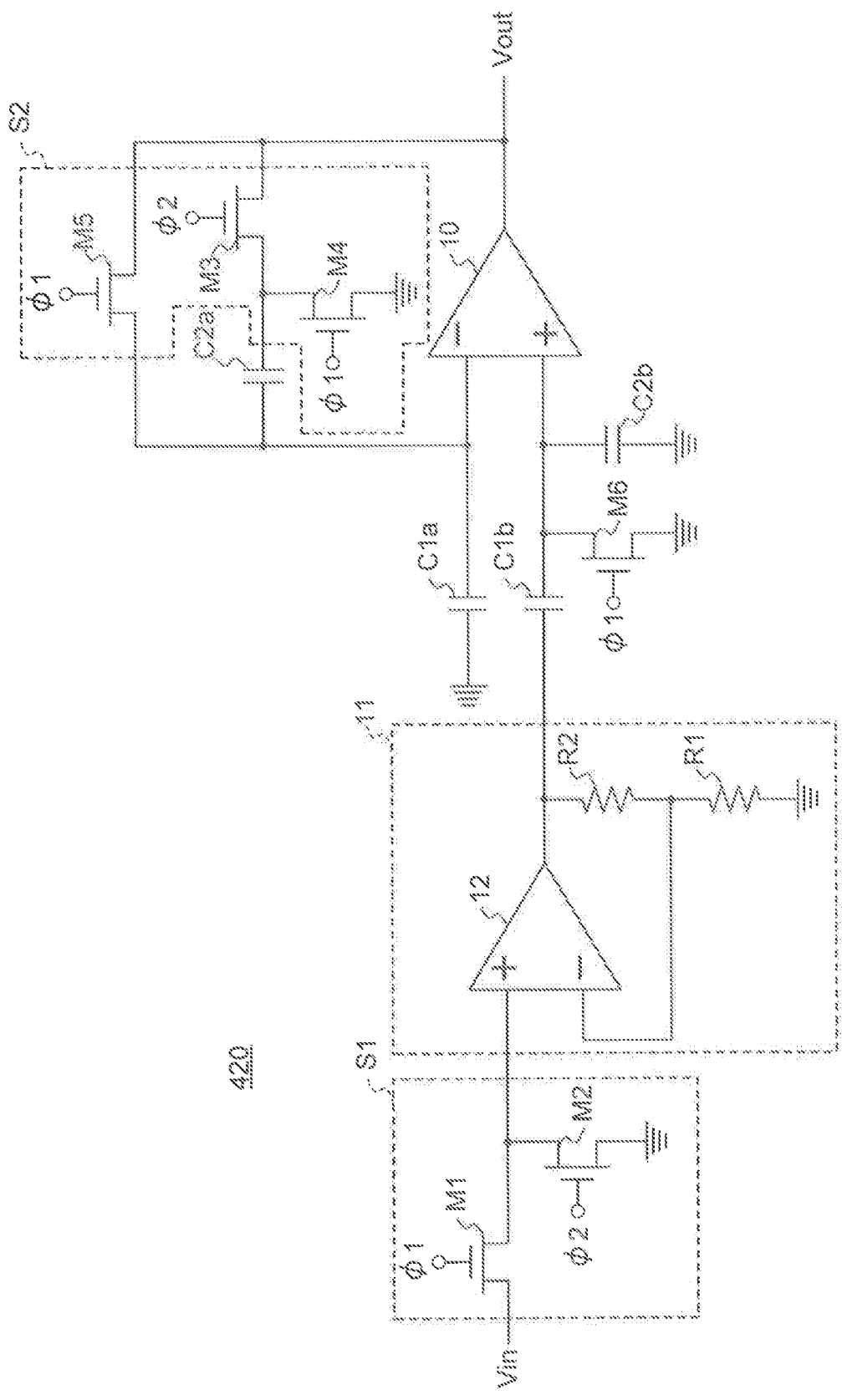
FIG. 15 is a circuit diagram illustrating a configuration of an amplifier circuit according to a fourth embodiment.

FIG. 15 is a circuit diagram illustrating a configuration of an amplifier circuit 420 according to a fourth embodiment. The amplifier circuit 420 is different from the amplifier circuit 220 according to the second embodiment in the point that the output terminal of the impedance converter circuit 11 is connected to the positive input terminal of the operational amplifier 10 through a capacitor C1b. The negative input terminal of the operational amplifier 10 is connected to a ground potential through a capacitor C1a. The capacitors C1a and C1b have the same capacitance value (capacitance value C1).

The negative input terminal of the operational amplifier 10 is connected to one end of the switch M3 through a capacitor C2a. The positive input terminal of the operational amplifier 10 is connected to a ground potential through a clock feedthrough cancellation circuit constituted of a switch M6 and a capacitor C2b. The capacitors C2a and C2b have the same capacitance value (capacitance value C2).

Figure 16:
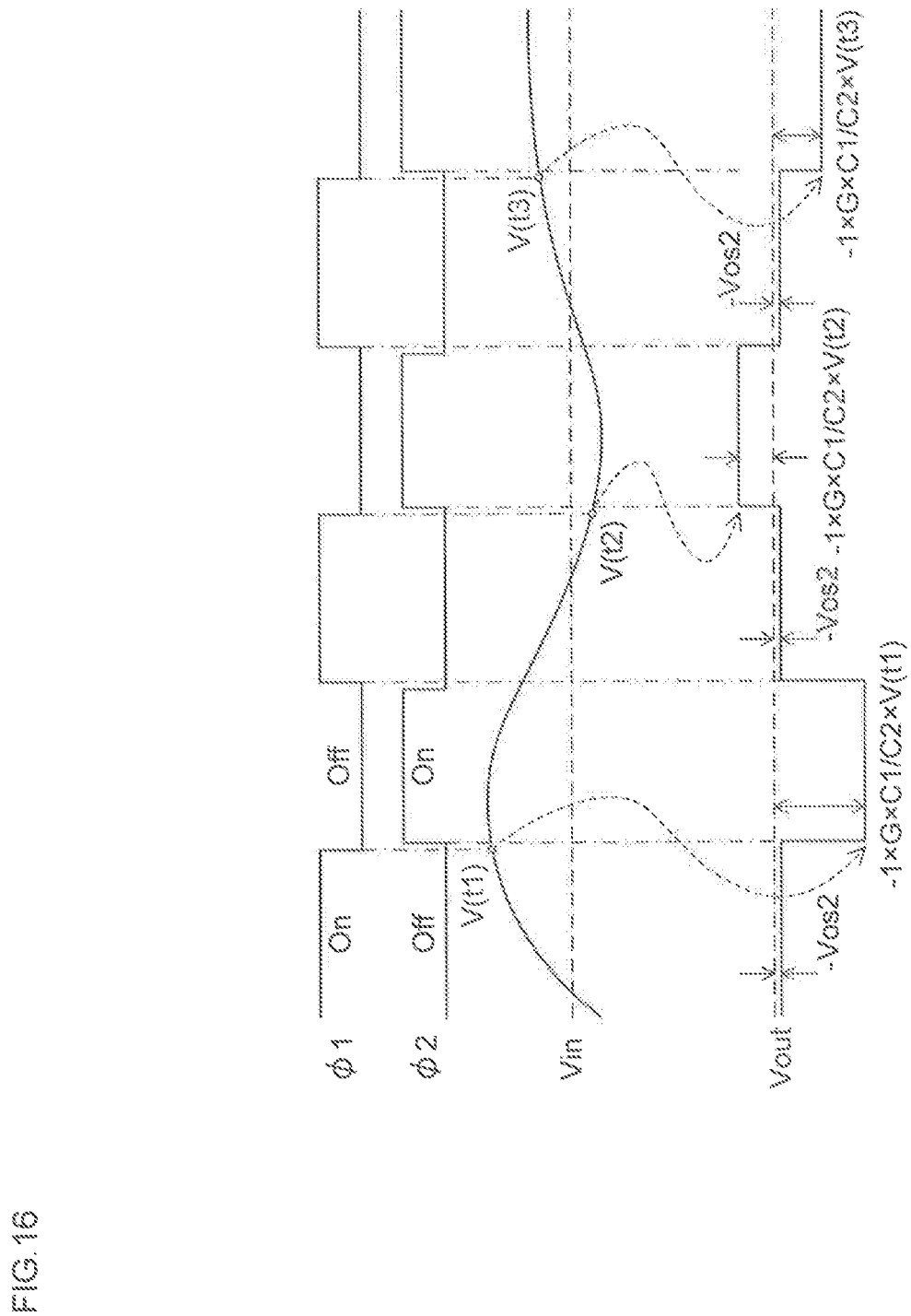
FIG. 16 is a time chart illustrating a relation among a switching signal, an input voltage, and an output voltage in the fourth embodiment.

FIG. 16 is a time chart illustrating time change in the first switching signal φ1, the second switching signal φ2, the input voltage Vin, and the output voltage Vout.

During the period from the time when the first switching signal φ1 becomes H level to the time when the second switching signal φ2 becomes H level, an offset voltage (−Vos2) of the operational amplifier 10 is output as the output voltage Vout.

Meanwhile, during the period from the time when the second switching signal φ2 becomes H level to the time when the first switching signal φ1 becomes H level, input voltages Vin (V(t1), V(t2), (t3)) at the times (t1, t2, t3) when each of the preceding first switching signals φ1 becomes L level are amplified with an amplification factor −1×G×(C1/C2), the amplified input voltages are output as the output voltages Vout. More specifically, the output voltages Vout are −G×C1/C2×V(t1), −G×C1/C2×V(t2), and −G×C1/C2×V(t3). Here, G is an amplification factor of the voltage amplifier circuit 11.

Thus, in the amplifier circuit 420 according to the present embodiment, the output voltage Vout that is opposite in phase to the output voltage Vout of the amplifier circuit 120 according to the first embodiment is output. Therefore, it is possible to provide the output voltage Vout of an opposite phase by switching the charging operation of an electric charge and the output operation of an amplified voltage at high speed, while suppressing the influence of the clock feedthrough.

Embodiment 5

Figure 17:
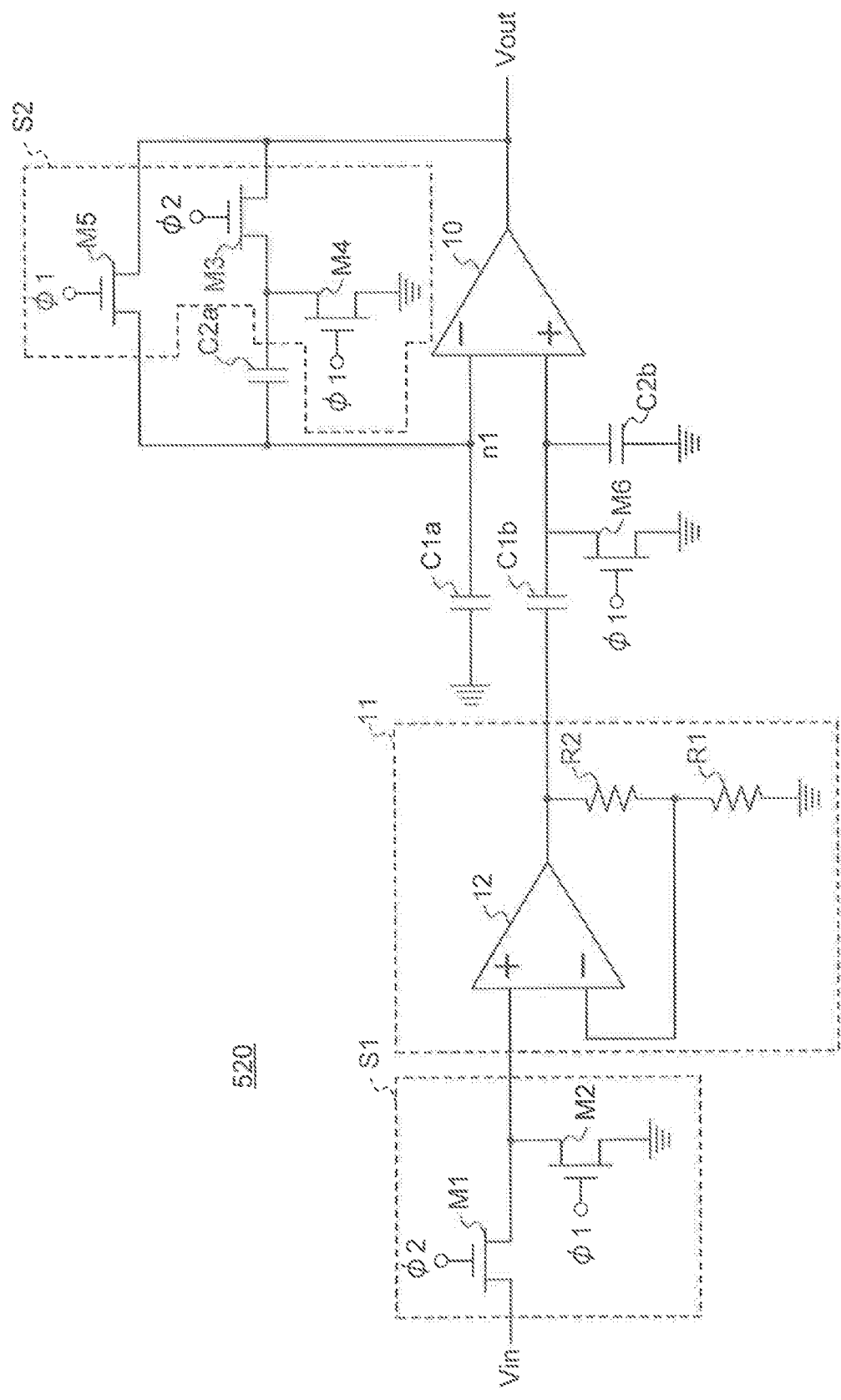
FIG. 17 is a circuit diagram illustrating a configuration of an amplifier circuit according to a fifth embodiment.

FIG. 17 is a circuit diagram illustrating a configuration of an amplifier circuit 520 according to a fifth embodiment.

The amplifier circuit 520 is different from the amplifier circuit 420 according to the fourth embodiment in the point that the switching signals supplied to the switches M1 and M2 are exchanged. More specifically, the switch M1 is turned on or off upon reception of the second switching signal φ2. The switch M2 is turned on or off upon reception of the first switching signal φ1.

Figure 18:
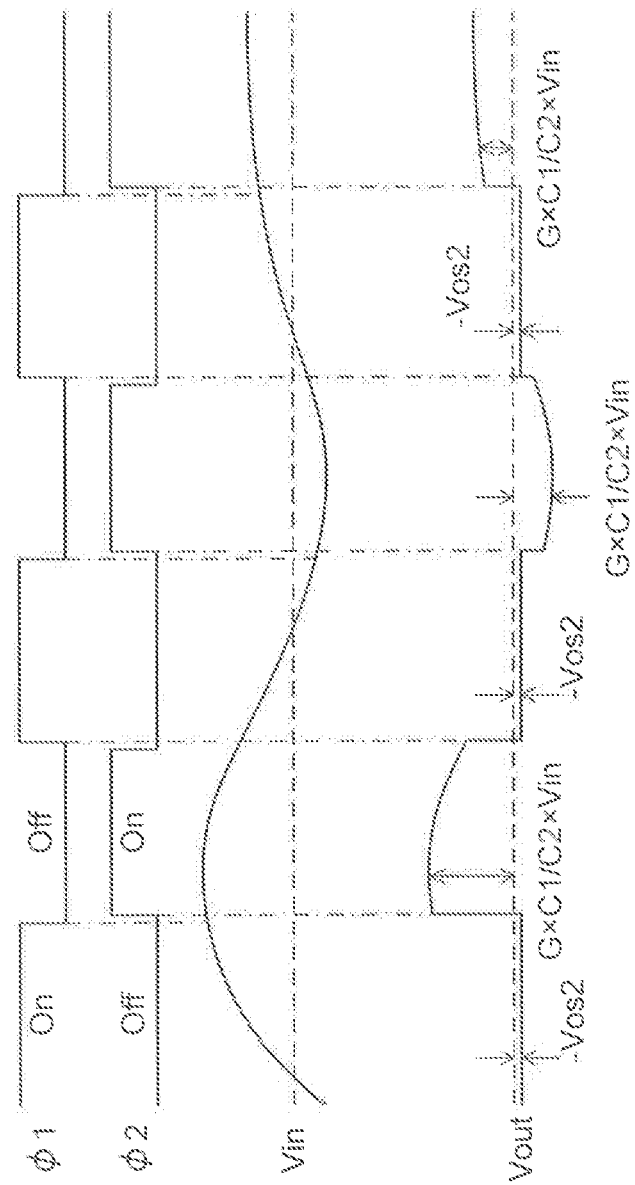
FIG. 18 is a time chart illustrating a relation among a switching signal, an input voltage, and an output voltage in the fifth embodiment.

FIG. 18 is a time chart illustrating time change in the first switching signal φ1, the second switching signal φ2, the input voltage Vin, and the output voltage Vout.

During the period when the first switching signal φ1 is at H level, i.e., during the period when the switches M2, M4, M5, and M6 are turned on, an offset voltage (−Vos2) of the operational amplifier 10 is output as the output voltage Vout.

During the period when the second switching signal φ2 is at H level, i.e., during the period when the switches M1 and M3 are turned on, a voltage obtained by amplifying the input voltage Vin with an amplification factor G×(C1/C2) is output as the output voltage Vout. More specifically, in the pertinent period, an output voltage Vout=G×(C1/C2)×Vin that is identical in phase to the input voltage Vin is output. Here, G is an amplification factor of the voltage amplifier circuit 11.

The amplifier circuit 520 according to the present embodiment can provide an output voltage Vout having a signal waveform corresponding to change in the input voltage Vin during the second operation.

Sixth Embodiment

Figure 19:
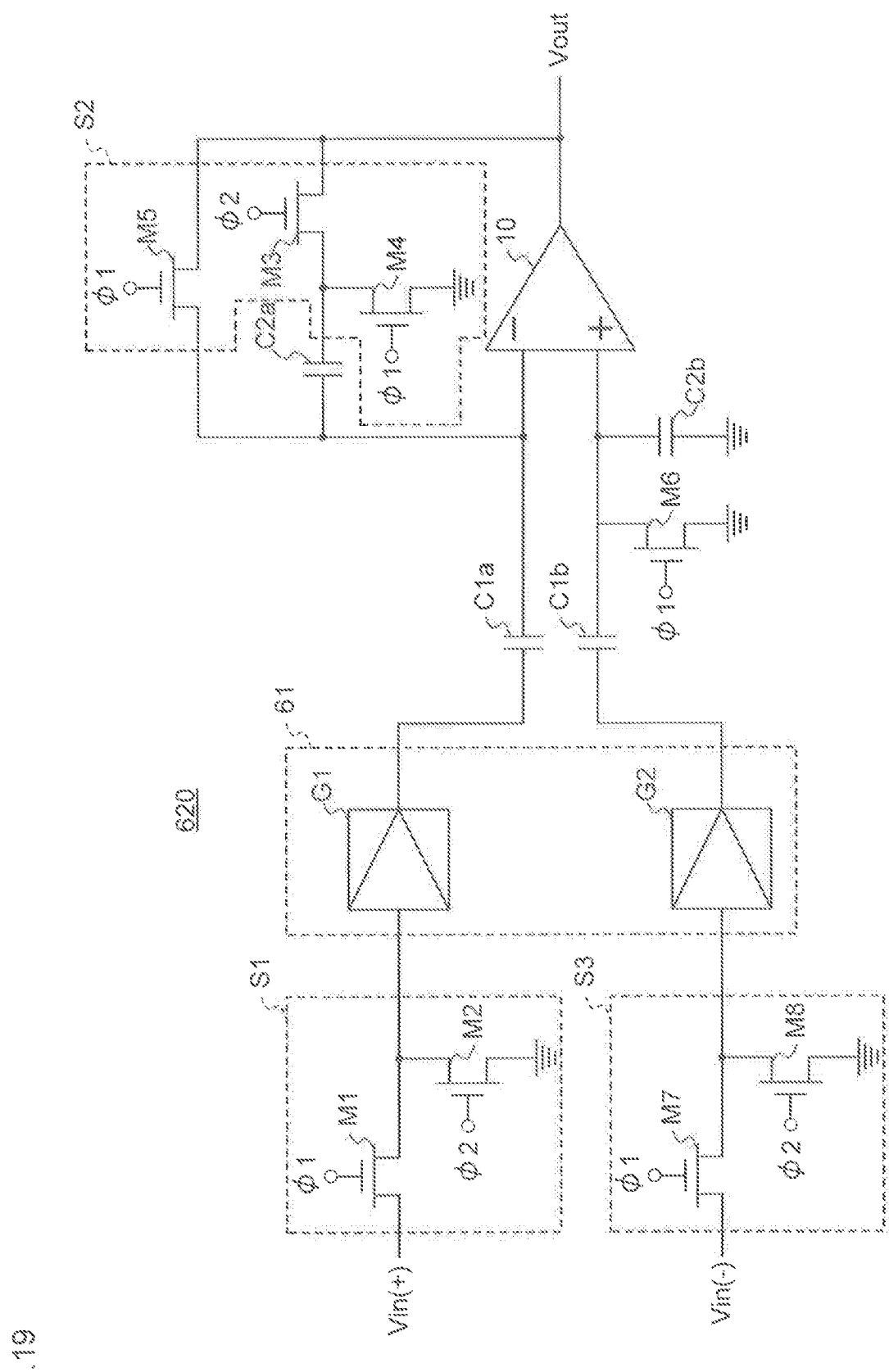
FIG. 19 is a circuit diagram illustrating a configuration of an amplifier circuit according to a sixth embodiment.

FIG. 19 is a circuit diagram illustrating a configuration of an amplifier circuit 620 according to a sixth embodiment. The amplifier circuit 620 has an impedance converter circuit 61 constituted of voltage amplifier circuits G1 and G2. The amplifier circuit 620 is different from the amplifier circuit 220 according to the second embodiment in the point that the amplifier circuit 620 receives input voltages Vin(+) and Vin(−) that are differential input signals supplied from first and second signal sources not illustrated.

The switching circuit S1 receives a positive input voltage Vin(+) supplied from the first signal source. When the switch M1 is turned on and the switch M2 is turned off, an input terminal of the voltage amplifier circuit G1 and the signal source are connected to each other. As a result, the input voltage Vin(+) is supplied to the voltage amplifier circuit G1. When the switch M1 is turned off and the switch M2 is turned on, the input terminal of the voltage amplifier circuit G1 is connected to a ground potential.

The input terminal of the voltage amplifier circuit G1 is connected to the switching circuit S1. An output terminal of the voltage amplifier circuit G1 is connected to the negative input terminal of the operational amplifier 10 through a capacitor C1a (capacitance C1). The voltage amplifier circuit G1 has an amplification factor G.

A switching circuit S3 is a switching circuit that switches connection upon reception of the first switching signal φ1 and the second switching signal φ2. The switching circuit S3 is constituted of a switch M7 and a switch M8.

The switch M7 is a switch element tuned on or off in response to the first switching signal φ1. The switch M7 is controlled to be turned on during the first operation and to be turned off during the second operation. The switch M7 is constituted of an N-channel MOS transistor, for example.

The switch M8 has one end connected to an input terminal of the voltage amplifier circuit G2. The switch M8 has the other end connected to a ground potential. The switch M8 is a switch element turned on or off in response to the second switching signal φ2. The switch M8 is controlled to be turned off during the first operation and to be turned on during the second operation. The switch M8 is constituted of an N-channel MOS transistor, for example.

The switching circuit S3 receives a negative input voltage Vin(−) supplied from the second signal source. When the switch M7 is turned on and the switch M8 is turned off, the input terminal of the voltage amplifier circuit G2 and the signal source are connected to each other. As a result, an input voltage Vin(−) is supplied to the voltage amplifier circuit G2. When the switch M7 is turned off and the switch M82 is turned on, the input terminal of the voltage amplifier circuit G2 is connected to a ground potential.

The input terminal of the voltage amplifier circuit G2 is connected to the switching circuit S3. An output terminal of the voltage amplifier circuit G2 is connected to the positive input terminal of the operational amplifier 10 through a capacitor C1b (capacitance C1). The voltage amplifier circuit G2 has the same amplification factor (amplification factor G) as the voltage amplifier circuit G1.

The capacitor C1b has one end connected to the output terminal of the voltage amplifier circuit G2. The capacitor C1b has the other end connected to the positive input terminal of the operational amplifier 10. The capacitor C1b has the same capacitance value as the capacitor C1a.

The switch M6 has one end connected to the positive input terminal of the operational amplifier 10 and to the other end of the capacitor C1b. The switch M6 is a switch element tuned on or off in response to the first switching signal φ1. The switch M6 is constituted of an N-channel MOS transistor, for example.

The capacitor C2b is a capacitative element having the same capacitance value (capacitance value C2) as the capacitor C2a. The capacitor C2b has one end connected to the positive input terminal of the operational amplifier 10 and to the other end of the capacitor C1b. The capacitor C2b has the other end connected to a ground potential.

The amplifier circuit 620 according to the present embodiment is a circuit that receives a positive input voltage Vin(+) and a negative input voltage Vin(−) as differential signals, amplifies a voltage difference Vin(+)−Vin(−) that is a difference between the input voltages, and outputs the amplified voltage as the output voltage Vout.

Figure 20:
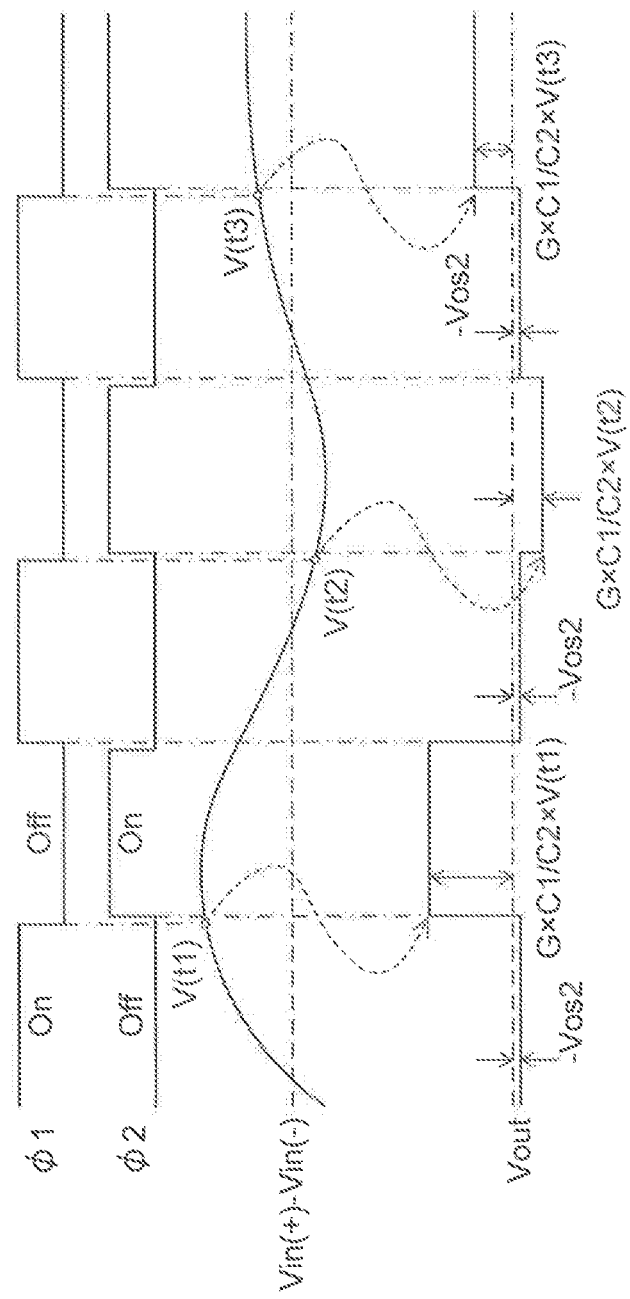
FIG. 20 is a time chart illustrating a relation among a switching signal, an input signal, and an output voltage in the sixth embodiment.

FIG. 20 is a time chart illustrating time change in the first switching signal φ1, the second switching signal φ2, the voltage difference Vin(+)−Vin(−), and the output voltage Vout.

During the period from the time when the first switching signal φ1 becomes H level to the time when the second switching signal φ2 becomes H level, an offset voltage (−Vos2) of the operational amplifier 10 is output as the output voltage Vout.

During the period from the time when the second switching signal φ2 becomes H level to the time when the first switching signal φ1 becomes H level, values (V(t1), V(t2), V(t3)) of the voltage difference Vin(+)−Vin(−) at the times (t1, t2, t3) when each of the preceding first switching signals φ becomes L level are amplified with an amplification factor G×(C1/C2), and the amplified voltages are output as the output voltages Vout. More specifically, the output voltages Vout are G×C1/C2×V(t1), G×C1/C2×V(t2), and G×C1/C2×V(t3), respectively.

Thus, the amplifier circuit 620 according to the present embodiment can provide the output voltage Vout obtained by amplifying the differential input signals (Vin(+), Vin(−)) by switching the charging operation of an electric charge and the output operation of an amplified voltage at high speed, while suppressing the influence of the clock feedthrough.

As in the case of the third embodiment and the fifth embodiment, the switching signals supplied to the switches M1 and M2 may be exchanged, and the signals supplied to the switches M7 and M8 may also be exchanged. More specifically, the switch M1 is controlled to be turned on or off upon reception of the second switching signal φ2, and the switch M2 is controlled to be turned on or off upon reception of the first switching signal φ1. The switch M7 is controlled to be turned on or off upon reception of the second switching signal φ2, and the switch M8 is controlled to be turned on or off upon reception of the first switching signal φ1. Accordingly, as in the case of the third embodiment and the fifth embodiment, the output voltage Vout having a signal waveform corresponding to change in the differential input signals (Vin(+), Vin(−)) can be provided during the second operation.

Seventh Embodiment

Figure 21:
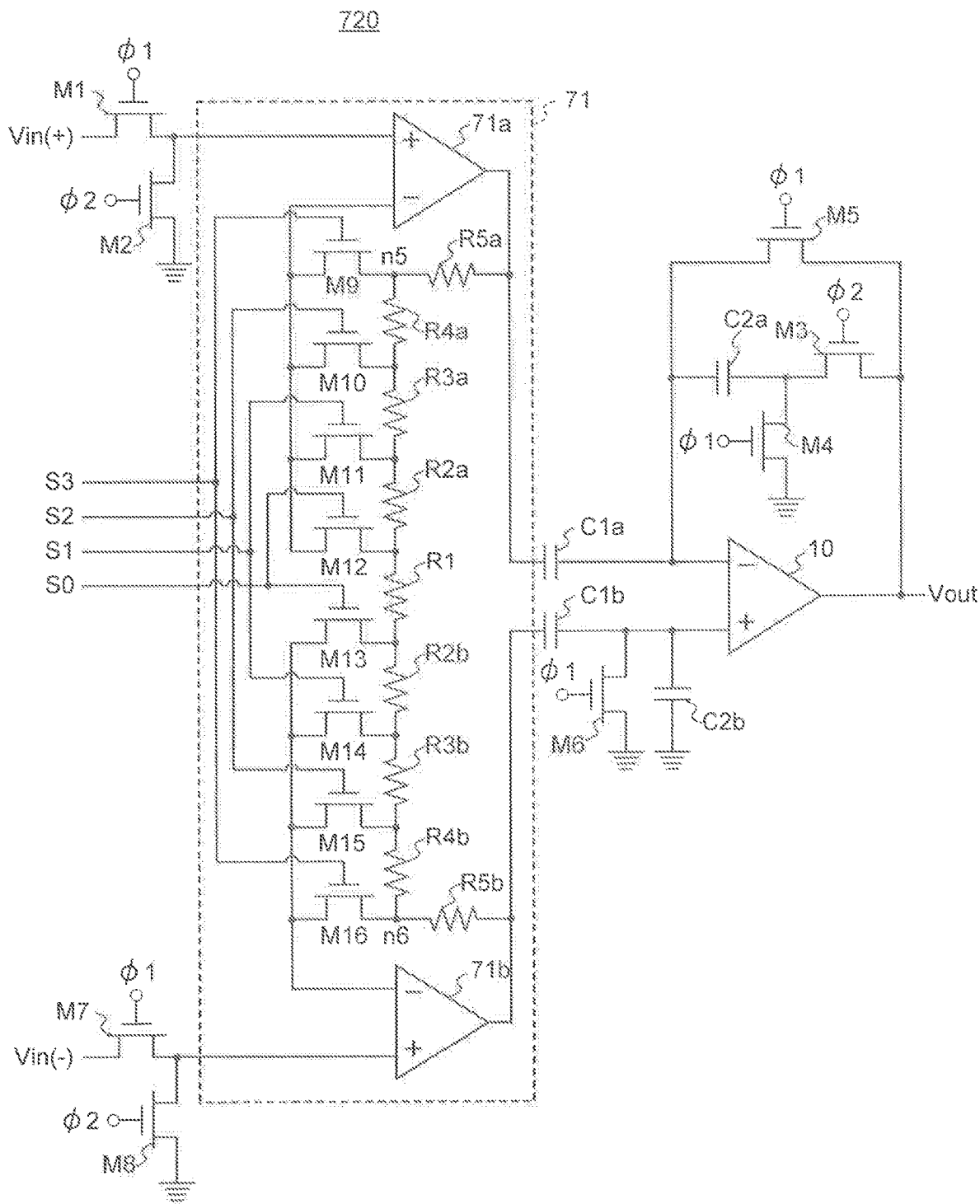
FIG. 21 is a circuit diagram illustrating a configuration of an amplifier circuit according to a seventh embodiment.

FIG. 21 is a circuit diagram illustrating a configuration of an amplifier circuit 720 according to a seventh embodiment. The amplifier circuit 720 is different from the amplifier circuit 620 of the sixth embodiment in the point that an impedance converter circuit 71 is configured as a programmable gain amplifier.

The impedance converter circuit 71 has operational amplifiers 71a and 71b. The operational amplifier 71a has an output terminal connected to the negative input terminal of the operational amplifier 10 through a capacitor C1a. The operational amplifier 71b has an output terminal connected to the positive input terminal of the operational amplifier 10 through a capacitor C1b.

Between the output terminal and a negative input terminal of the operational amplifier 71a, switches M9 to M12 are connected in parallel with each other. The switches M9 to M12 are each constituted of an N-channel MOS transistor, for example. Each of the switches M9 to M12 has one end connected to the negative input terminal of the operational amplifier 71a. Each of the switches M13 to M16 has one end connected to a negative input terminal of the operational amplifier 71b.

The switch M9 has the other end connected to the output terminal of the operational amplifier 71a through a node n5 and a resistance R5a. The switch M16 has the other end connected to the output terminal of the operational amplifier 71b through a node n6 and a resistance R5b. Between the node n5 and the node n6, resistances R4a, R3a, R2a, R1, R2b, R3b, and R4b are connected in series. The resistance R2b has a resistance value R2 same as the resistance R2a. The resistance R3b has a resistance value R3 same as the resistance R3a. The resistance R4b has a resistance value R4 same as the resistance R4a. The resistance R5b has a resistance value R5 same as the resistance R5a.

The switch M9 has one end connected to the negative input terminal of the operational amplifier 71a. The switch M9 has the other end connected to the output terminal of the operational amplifier 71a through the resistance R5a. The switch M9 is controlled to be turned on or off in response to a selecting signal S3. When the switch M9 is turned on, the negative input terminal and the output terminal of the operational amplifier 71a are connected to each other through the resistance R5a.

The switch M10 has one end connected to the negative input terminal of the operational amplifier 71a. The switch M10 has the other end connected to the output terminal of the operational amplifier 71a through the resistances R4a and R5a. The switch M10 is controlled to be turned on or off in response to a selecting signal S2. When the switch M10 is turned on, the negative input terminal and the output terminal of the operational amplifier 71a are connected to each other through the resistances R4a and R5a.

The switch M11 has one end connected to the negative input terminal of the operational amplifier 71a. The switch M11 has the other end connected to the output terminal of the operational amplifier 71a through the resistances R3a, R4a, and R5a. The switch M11 is controlled to be turned on or off in response to a selecting signal S1. When the switch M11 is turned on, the negative input terminal and the output terminal of the operational amplifier 71a are connected to each other through the resistances R3a, R4a, and R5a.

The switch M12 has one end connected to the negative input terminal of the operational amplifier 71a. The switch M12 has the other end connected to the output terminal of the operational amplifier 71a through the resistances R2a, R3a, R4a, and R5a. The switch M12 is controlled to be turned on or off in response to a selecting signal S0. When the switch M12 is turned on, the negative input terminal and the output terminal of the operational amplifier 71a are connected to each other through the resistances R2a, R3a, R4a, and R5a.

The switch M13 has one end connected to the negative input terminal of the operational amplifier 71b. The switch M13 has the other end connected to the output terminal of the operational amplifier 71b through the resistances R2b, R3b, R4b, and R5b. The switch M13 is controlled to be turned on or off in response to the selecting signal S0. When the switch M13 is turned on, the negative input terminal and the output terminal of the operational amplifier 71b are connected to each other through the resistances R2b, R3b, R4b, and R5b.

The switch M14 has one end connected to the negative input terminal of the operational amplifier 71b. The switch M14 has the other end connected to the output terminal of the operational amplifier 71b through the resistances R3b, R4b, and R5b. The switch M14 is controlled to be turned on or off in response to the selecting signal S1. When the switch M14 is turned on, the negative input terminal and the output terminal of the operational amplifier 71b are connected to each other through the resistances R3b, R4b, and R5b.

The switch M15 has one end connected to the negative input terminal of the operational amplifier 71b. The switch M15 has the other end connected to the output terminal of the operational amplifier 71b through the resistances R4b and R5b. The switch M15 is controlled to be turned on or off in response to the selecting signal S2. When the switch M15 is turned on, the negative input terminal and the output terminal of the operational amplifier 71b are connected to each other through the resistances R4b and R5b.

The switch M16 has one end connected to the negative input terminal of the operational amplifier 71b. The switch M16 has the other end connected to the output terminal of the operational amplifier 71b through the resistance R5b. The switch M16 is controlled to be turned on or off in response to the selecting signal S3. When the switch M16 is turned on, the negative input terminal and the output terminal of the operational amplifier 71b are connected to each other through the resistance R5b.

The selecting signals S0 to S3 are controlled such that any one signal is set to signal level H (i.e., turned on) and the remaining three signals are set to signal level L (i.e., turned off). Hence, among a pair of the switches M9 and M16, a pair of the switches M10 and M15, a pair of the switches M11 and M14, and a pair of the switches M12 and M13, any one pair is controlled to be turned on, while the remaining three pairs are controlled to be turned off.

The state (ON or OFF) of the switches M9 to M16 changes in response to ON/OFF of the selecting signals S0 to S3, and the resistance values of the resistances connected to the output terminals and the negative input terminals of the operational amplifiers 71a and 71b are switched. Accordingly, the voltage gain G of the impedance converter circuit 71 as a voltage amplifier circuit changes.

FIG. 22 is a table illustrating a relation between the signal level of the selecting signals S0 to S3 and the voltage gain G.

When the selecting signal S0 is turned on, and the selecting signals S1 to S3 are turned off, the switches M12 and M13 are turned on, and the other switches are turned off. Consequently, the negative input terminal and the output terminal of the operational amplifier 71a are connected to each other through the resistances R2a, R3a, R4a, and R5a. The negative input terminal and the output terminal of the operational amplifier 71b are also connected to each other through the resistances R2b, R3b, R4b, and R5b. The operational amplifiers 71a and 71b are connected to each other through the resistance R1. As a consequence, the voltage gain is defined by $G=2\times(R5+R4+R3+R2)/R1$.

When the selecting signal S1 is turned on, the selecting signals S0, S2, and S3 are turned off, the switches M11 and M14 are turned on, and the other switches are turned off. As a consequence, the negative input terminal and the output terminal of the operational amplifier 71a are connected to each other through the resistances R3a, R4a, and R5a. The negative input terminal and the output terminal of the operational amplifier 71b are also connected to each other through the resistances R3b, R4b, and R5b. The operational amplifiers 71a and 71b are connected to each other through the resistances R1, R2a, and R2b. As a consequence, the voltage gain is defined by $G=2\times(R5+R4+R3)/(2\times R2+R1)$.

When the selecting signal S2 is turned on, and the selecting signals S0, S1, and S3 are turned off, the switches M10 and M15 are turned on, and the other switches are turned off. As a consequence, the negative input terminal and the output terminal of the operational amplifier 71a are connected to each other through the resistances R4a and R5a. The negative input terminal and the output terminal of the operational amplifier 71b are also connected to each other through the resistances R4b and R5b. The operational amplifiers 71a and 71b are connected to each other through the resistances R1, R2a, R3a, R2b, and R3b. As a result, the voltage gain is defined by $G=2\times(R5+R4)/\{2\times(R3+R2)+R1\}$.

When the selecting signal S3 is turned on and the selecting signals S0, S1, and S2 are turned off, the switches M9 and M16 are turned on, and the other switches are turned off. As a consequence, the negative input terminal and the output terminal of the operational amplifier 71a are connected to each other through the resistance R5a. The negative input terminal and the output terminal of the operational amplifier 71b are also connected to each other through the resistance R5b. The operational amplifiers 71a and 71b are connected to each other through the resistances R1, R2a, R3a, R4a, R2b, R3b, and R4b. As a result, the voltage gain is defined by $G=2\times R5/\{2\times(R4+R3+R2)+R1\}$ As described in the foregoing, the amplifier circuit 720 according to the present embodiment can selectively change the amplification gain in the amplifier circuit configured to amplify an input voltage that is a differential input signal and to generate an output voltage. As in the second embodiment, the amplifier circuit according to the present embodiment can switch the charging operation of an electric charge and the output operation of an amplified voltage at high speed, while suppressing the influence of the clock feedthrough.

As in the case of the third embodiment and the fifth embodiment, the switching signals supplied to the switches M1 and M2 may be exchanged, and the signals supplied to the switches M7 and M8 may also be exchanged. More specifically, the switch M1 is controlled to be turned on or off upon reception of the second switching signal φ2, and the switch M2 is controlled to be turned on or off upon reception of the first switching signal φ1. The switch M7 is controlled to be turned on or off upon reception of the second switching signal φ2, and the switch M8 is controlled to be turned on or off upon reception of the first switching signal φ1. Accordingly, as in the case of the third embodiment and the fifth embodiment, the output voltage Vout having a signal waveform corresponding to change in the differential input signal (Vin(+), Vin(−)) can be provided during the second operation.

The present invention is not limited to the embodiments described above. For example, although the impedance converter circuit is a voltage amplifier circuit in the aforementioned embodiments, the impedance converter circuit may be a circuit with amplification gain of unity. In short, the impedance converter circuit may be any circuit as long as the output impedance of a signal source is converted to a smaller impedance.

Although the switches are each an N-channel MOS transistor in the aforementioned embodiments, the switches may be constituted of a P-channel MOS transistor having an opposite conductivity type.

Although the amplifier circuit is used for the infrared sensor device in the aforementioned embodiments, the amplifier circuit according to the present invention may be applied to other devices. When the amplifier circuit according to the present invention is applied to the devices having a relatively high output impedance of a signal source, high-speed switching operation can be performed by converting the output impedance.

In the seventh embodiment described above, the gain of the amplifier circuit changes in four stages as the switches M9 to M16 are turned on or off in response to the selecting signals S0 to S3. However, a value of the amplification factor usable as the amplification gain and the number thereof are not limited thereto. For example, when the number of the selecting signals is defined as n (n being natural numbers), and the number of the switches and resistances are set in accordance with n, the amplification gain may be changed in n stages.

It is understood that the foregoing description and accompanying drawings set forth the preferred embodiments of the present invention at the present time. Various modifications, additions and alternative designs will, of course, become apparent to those skilled in the art in light of the foregoing teachings without departing from the spirit and scope of the disclosed invention. Thus, it should be appreciated that the present invention is not limited to the disclosed Examples but may be practiced within the full scope of the appended claims.

This application is based upon and claims the benefit of priority from the prior Japanese Patent Application No. 2017-093049 filed on May 9, 2017, the entire contents of which are incorporated herein by reference.

What is claimed is:

1. A switched capacitor amplifier circuit configured to perform a first operation and a second operation, the first operation being configured to retain an electric charge corresponding to an input voltage upon reception of said input voltage from a signal source, the second operation being configured to amplify said input voltage and to output the amplified input voltage as an output voltage, the switched capacitor amplifier circuit comprising:

an operational amplifier including a positive input terminal, a negative input terminal, and an output terminal, the operational amplifier being configured to output said output voltage from said output terminal;

a first capacitor having a first end and a second end, the first end being connected to said negative input terminal of said operational amplifier;

a second capacitor having a first end and a second end, the first end being connected to said negative input terminal of said operational amplifier;

a first switching circuit configured to connect the second end of said first capacitor to said signal source during said first operation, and to connect the second end of said first capacitor to a fixed potential during said second operation;

a second switching circuit configured to connect the second end of said second capacitor to said fixed potential while short-circuiting said output terminal and said negative input terminal of said operational amplifier during said first operation, and to connect the second end of said second capacitor and said output terminal of said operational amplifier so as to connect said output terminal and said negative input terminal of said operational amplifier through said second capacitor during said second operation;

a third capacitor having a capacitance according to a sum of a capacitance of said first capacitor and a capacitance of said second capacitor, the third capacitor having a first end connected to said positive input terminal of said operational amplifier and a second end connected to said fixed potential;

a third switching circuit configured to connect said positive input terminal of said operational amplifier to said fixed potential during said first operation, and to disconnect said positive input terminal of said operational amplifier from said fixed potential; and an impedance converter circuit configured to convert an output impedance of the signal source into a specified impedance, the impedance converter circuit being connected between said first switching circuit and the second end of said first capacitor.

2. The switched capacitor amplifier circuit according to claim 1, wherein
said impedance converter circuit is a voltage amplifier circuit configured to amplify said input voltage and to supply the amplified input voltage to said operational amplifier.

3. The switched capacitor amplifier circuit according to claim 1, wherein
said first switching circuit includes:
a first switch configured to connect between an input terminal of said impedance converter circuit and said signal source in response to a first switching signal; and
a second switch configured to supply said fixed potential to the input terminal of said impedance converter circuit in response to a second switching signal, and
said second switching circuit includes:
a third switch configured to connect between the second end of said second capacitor and said output terminal of said operational amplifier in response to said second switching signal;

a fourth switch configured to supply said fixed potential to the second end of said second capacitor in response to said first switching signal; and a fifth switch configured to connect between said output terminal and said negative input terminal of said operational amplifier in response to said first switching signal.

4. The switched capacitor amplifier circuit according to claim 3, wherein said third switching circuit includes a sixth switch configured to supply said fixed potential to said positive input terminal of said operational amplifier in response to said first switching signal.

* * * * *